(12) United States Patent
Fried et al.

(10) Patent No.: US 8,832,620 B1
(45) Date of Patent: Sep. 9, 2014

(54) RULE CHECKS IN 3-D VIRTUAL FABRICATION ENVIRONMENT

(71) Applicant: Coventor, Inc., Cary, NC (US)

(72) Inventors: David M. Fried, South Salem, NY (US); Kenneth B. Greiner, Arlington, MA (US); Mark J. Stock, Newton Center, MA (US); Stephen R. Breit, Wayland, MA (US)

(73) Assignee: Coventor, Inc., Cary, NC (US)

( * ) Notice: Subject to any disclaimer, the term of this patent is extended or adjusted under 35 U.S.C. 154(b) by 0 days.

(21) Appl. No.: 13/831,444

(22) Filed: Mar. 14, 2013

(51) Int. Cl.
*G06F 17/50* (2006.01)

(52) U.S. Cl.
CPC .................. *G06F 17/5081* (2013.01)
USPC ........................................................ 716/110

(58) Field of Classification Search
USPC ................................................. 716/100, 110
See application file for complete search history.

(56) References Cited

U.S. PATENT DOCUMENTS

| | | | |
|---|---|---|---|
| 7,526,739 B2 * | 4/2009 | McIlrath | 716/118 |
| 8,032,857 B2 * | 10/2011 | McIlrath | 716/139 |
| 8,209,649 B2 * | 6/2012 | McIlrath | 716/110 |
| 8,266,560 B2 * | 9/2012 | McIlrath | 716/101 |
| 2005/0198602 A1 * | 9/2005 | Brankner | 716/8 |
| 2009/0055789 A1 * | 2/2009 | McIlrath | 716/10 |
| 2009/0064058 A1 * | 3/2009 | McIlrath | 716/1 |
| 2010/0005437 A1 * | 1/2010 | McIlrath | 716/10 |
| 2011/0185323 A1 * | 7/2011 | Hogan et al. | 716/52 |
| 2011/0314437 A1 * | 12/2011 | McIlrath | 716/139 |
| 2012/0317528 A1 * | 12/2012 | McIlrath | 716/112 |
| 2013/0339918 A1 * | 12/2013 | Clark | 716/122 |

* cited by examiner

*Primary Examiner* — Suchin Parihar

(74) *Attorney, Agent, or Firm* — Nelson Mullins Riley & Scarborough LLP; John S. Curran

(57) ABSTRACT

A virtual fabrication environment that enables 3D Design Rule Checks (DRCs) or Optical Rule Checks (ORCs) on 3D structural models of semiconductor devices to be performed is discussed. The virtual fabrication environment may perform 3D design rule checks, such as minimum line width, minimum space between features, and minimum contact area between adjacent materials, directly in 3D without making assumptions about the translation from 2D design data to a 3D structure effected by an integrated process flow for semiconductor devices. The required number of 3D design rule checks may therefore be significantly reduced from the number of design rule checks required in 2D environments. Embodiments may also perform the 3D design rule checks for a range of statistical variations in process and design parameters.

20 Claims, 28 Drawing Sheets

Figure 11

| Assembly File | C:\STI_Example\Virtual_3way_Grid\STI_Example.vam |
| --- | --- |
| Process File | C:\STI_Example\Virtual_3way_Grid\STI_Example.vproc |
| Layout File | C:\STI_Example\Virtual_3way_Grid\Demo_Layouts.cat |
| Layer Map File | |
| Top Cell | Cell6x6 |
| Output directory | STI_Example_batch |
| Working directory | C:\STI_Example\Virtual_3way_Grid |

| Run | 1.1:depth | 1.22:depth | 2:depth | STP_STPG_DGL | THK_STPBN_STI | STP_STPG_PNS | STP_STPG_GDD |
| --- | --- | --- | --- | --- | --- | --- | --- |
| 0 (1) | 15.5 | 52.5 | 2 | 24.381696 | 167 | 11.985417 | 10.757186 |
| 1 (2) | 17.75 | 52.5 | 2 | 27.539265 | 164 | 8.658854 | 7.441058 |
| 2 (3) | 20 | 52.5 | 2 | 30.732833 | 160 | 5.37036 | 4.127793 |
| 3 (4) | 22.25 | 52.5 | 2 | 33.890625 | 157 | 2.116406 | 0.856027 |
| 4 (5) | 24.5 | 52.5 | 2 | 37.047595 | 154 | NaN | NaN |
| 5 (6) | 15.5 | 56.25 | 2 | 24.381696 | 167 | 11.871823 | 10.651568 |
| 6 (7) | 17.75 | 56.25 | 2 | 27.539265 | 164 | 8.582142 | 7.317439 |
| 7 (8) | 20 | 56.25 | 2 | 30.732833 | 160 | 5.269715 | 4.032957 |
| 8 (9) | 22.25 | 56.25 | 2 | 33.890625 | 157 | 2.012943 | 0.780521 |
| 9 (10) | 24.5 | 56.25 | 2 | 37.047595 | 153 | NaN | NaN |
| 10 (11) | 15.5 | 60 | 2 | 24.381696 | 167 | 11.795147 | 10.529856 |
| 11 (12) | 17.75 | 60 | 2 | 27.539265 | 163 | 8.481802 | 7.22371 |
| 12 (13) | 20 | 60 | 2 | 30.732833 | 160 | 5.165463 | 3.942212 |
| 13 (14) | 22.25 | 60 | 2 | 33.890625 | 157 | 1.894331 | NaN |
| 14 (15) | 24.5 | 60 | 2 | 37.047595 | 153 | NaN | NaN |
| 15 (16) | 15.5 | 63.75 | 2 | 24.381696 | 167 | 11.693668 | 10.415309 |
| 16 (17) | 17.75 | 63.75 | 2 | 27.539265 | 163 | 8.37849 | 7.159459 |

1102: STP_STPG_DGL column group label
1104: brace encompassing THK_STPBN_STI, STP_STPG_PNS, STP_STPG_GDD
124

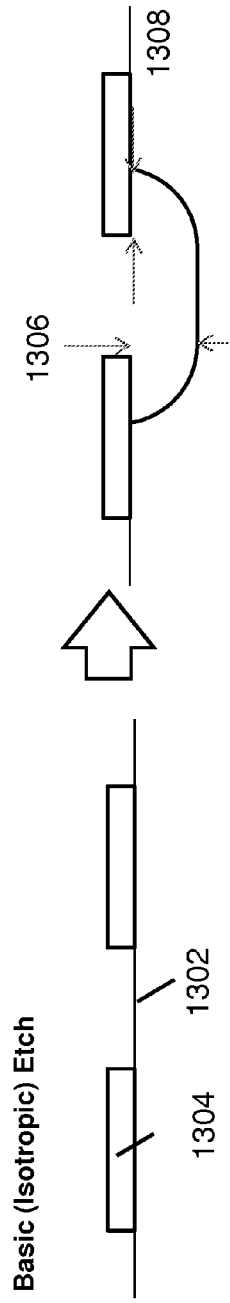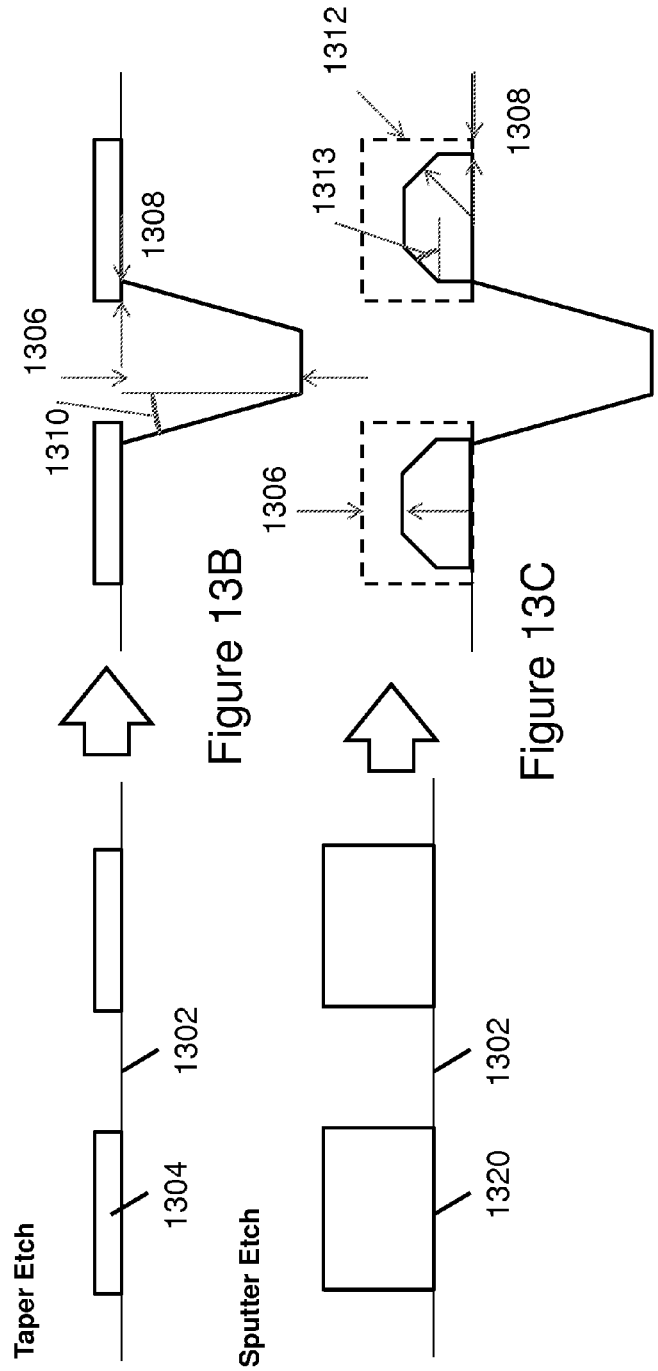

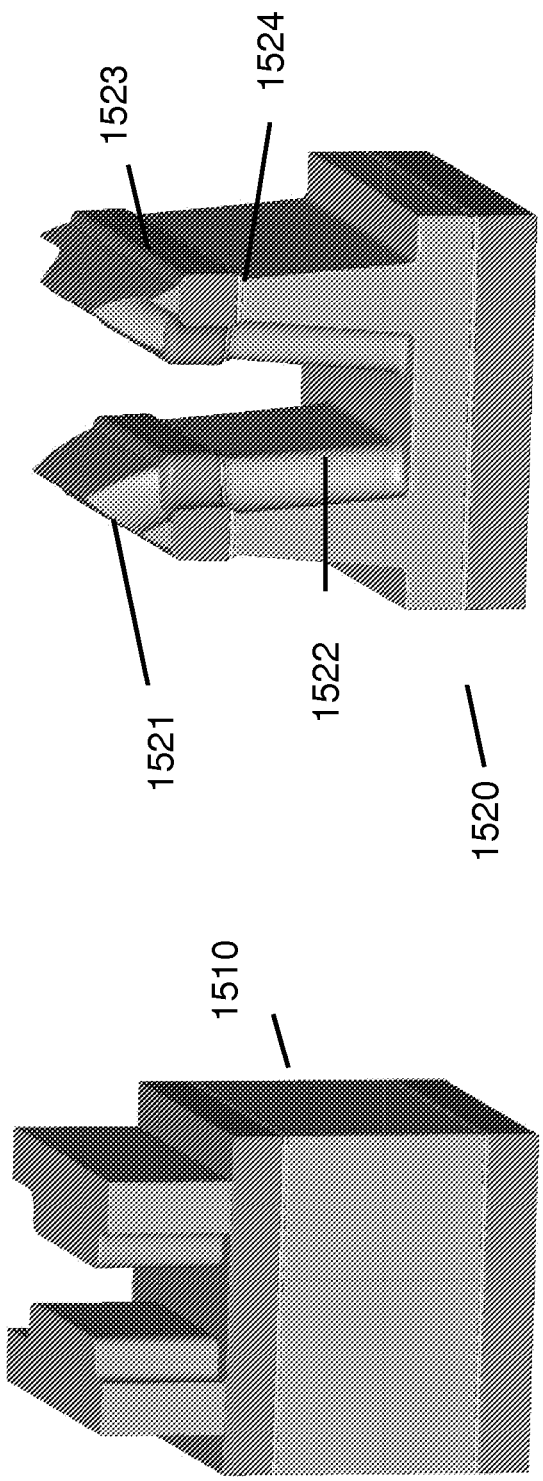

RULE CHECKS IN 3-D VIRTUAL FABRICATION ENVIRONMENT

BACKGROUND

Semiconductor development organizations at integrated device manufacturers (IDMs) and independent foundries spend significant resources developing the integrated sequence of process operations used to fabricate the chips (integrated circuits (ICs)) they sell from wafers ("wafers" are thin slices of semiconductor material, frequently, but not always, composed of silicon crystal). A large portion of the resources is spent on fabricating experimental wafers and associated measurement, metrology ("metrology" refers to specialized types of measurements conducted in the semiconductor industry) and characterization structures, all for the purpose of ensuring that the integrated process produces the desired semiconductor device structures. These experimental wafers are used in a trial-and-error scheme to develop individual processes for the fabrication of a device structure and also to develop the total, integrated process flow. Due to the increasing complexity of advanced technology node process flows, a large portion of the experimental fabrication runs result in negative or null characterization results. These experimental runs are long in duration, weeks to months in the "fab" (fabrication environment), and expensive, as each experimental wafer may cost $3,000-$10,000. Recent semiconductor technology advances, including FinFET, TriGate, High-K/Metal-Gate, embedded memories and advanced patterning, have dramatically increased the complexity of integrated semiconductor fabrication processes. The cost and duration of technology development using this trial-and-error experimental methodology has concurrently increased.

Attempts have been made to use conventional mechanical computer-aided design (CAD) tools and specialized technology CAD (TCAD) tools to model semiconductor device structures, with the goal of reducing the efforts spent on fabricating experimental wafers. General-purpose mechanical CAD tools have been found inadequate because they do not automatically mimic the material addition, removal, and modification processes that occur in an actual fab. TCAD tools, on the other hand, are physics-based modeling platforms that simulate material composition changes that occur during diffusion and implant processes, but not all of the material addition and removal effects that occur during other processes that comprise an integrated process flow. Typically, the 3D device structure is an input to TCAD, not an output. Furthermore, because of the amount of data and computations required for physics-based simulations of processes, TCAD simulations are practically restricted to very small regions on a chip, most often encompassing just a single transistor. In state-of-the-art semiconductor fabrication technologies, most of the integration challenge concerns the interaction between processes that may be widely separated in the integrated process flow, and the multiple different devices and circuits that comprise a full technology suite (transistors, resistors, capacitors, memories, etc.). Structural failures, stemming from both systematic and random effects, are typically the limiter in time-to-market for a new process technology node. As such, a different modeling platform and approach than mechanical CAD or TCAD is required to cover the larger scope of concern, and to model the entire integrated process flow in a structurally predictive fashion.

A virtual fabrication environment for a semiconductor device structures offers a platform for performing semiconductor process development at a lower cost and higher speed than is possible with conventional trial-and-error physical experimentation. In contrast to conventional CAD and TCAD environments, a virtual fabrication environment is capable of virtually modeling an integrated process flow and predicting the complete 3D structures of all devices and circuits that comprise a full technology suite. Virtual fabrication can be described in its most simple form as combining a description of an integrated process sequence with a subject design, in the form of 2D design data (masks or layout), and producing a 3D structural model that is predictive of the result expected from a real/physical fabrication run. A 3D structural model includes the geometrically accurate 3D shapes of multiple layers of materials, implants, diffusions, etc. that comprise a chip or a portion of a chip. Virtual fabrication is done in way that is primarily geometric, however the geometry involved is instructed by the physics of the fabrication processes. By performing the modeling at the structural level of abstraction (rather than physics-based simulations), construction of the structural models can be dramatically accelerated, enabling full technology modeling, at a circuit-level area scale. The use of a virtual fabrication environment thus provides fast verification of process assumptions, and visualization of the complex interrelationship between the integrated process sequence and the 2D design data.

BRIEF SUMMARY

Embodiments of the present invention enable 3D Design Rule Checks (DRCs) or Optical Rule Checks (ORCs) to be performed in a virtual fabrication environment. Traditionally these checks have been performed in a 2D design environment requiring assumptions to be made about the 3D device structure being produced. In contrast, the virtual fabrication environment of the present invention may perform 3D design rule checks, such as minimum line width, minimum space between features, and minimum contact area between adjacent materials, directly in 3D without making assumptions about the translation from 2D to 3D. The required number of 3D design rule checks therefore may be significantly reduced from the number of design rule checks required in 2D environments. Furthermore, with such a reduced set of 3D design check rules, the virtual fabrication environment can perform the checks for a range of statistical variations in process parameters and 2D design parameters.

In one embodiment a computing device-implemented method for performing and developing design rule checks with a 3D structural model for a semiconductor device structure includes receiving a selection of a process sequence and 2D design data for a semiconductor device structure to be virtually fabricated. The method further includes performing a virtual fabrication run for the device structure using the process sequence and 2D design data. The virtual fabrication run builds a 3D structural model. The method also performs a set of 3D design rule checks by searching the 3D structural model for locations where specified minimum or maximum dimensional criteria are satisfied.

In another embodiment, a virtual fabrication system includes a computing device equipped with a processor and configured to receive input data with a 3D modeling engine. The input data includes 2D design data and a process sequence for a semiconductor device structure to be virtually fabricated in a virtual fabrication run for the device structure. The virtual fabrication run builds a 3D structural model upon which 3D design rule checks are performed by searching the 3D structural model for locations where specified minimum or maximum dimensional criteria are satisfied. The virtual fabrication system also includes a display surface in communication with the computing device that displays results of the 3D design rule checks.

BRIEF DESCRIPTION OF THE DRAWINGS

The accompanying drawings, which are incorporated in and constitute a part of this specification, illustrate one or more embodiments of the invention and, together with the description, help to explain the invention. In the drawings:

FIG. 11 depicts an exemplary tabular-formatted display of virtual metrology data generated in a virtual experiment in an embodiment of the present invention;

FIGS. 13A-C depict the effect of isotropic, taper and sputter etching behavior by the multi-etch process of the present invention;

FIGS. 15B-C depict related before and after 3D models generated by virtual fabrication performing the multi-etch process step of FIG. 15A in an embodiment of the present invention, respectively;

DETAILED DESCRIPTION

Embodiments of the present invention provide a faster and more economical approach to semiconductor device structure development. By enhancing a virtual fabrication environment to include the use of virtual metrology measurement data, the effect of alterations in a process or process sequence on device structure can be determined, leading to an optimized fabrication sequence. Further, by calibrating the virtual fabrication environment by comparing virtual metrology data generated from a virtual fabrication run with a subset of measurements performed in a physical fabrication environment, the virtual fabrication environment of the present invention becomes increasingly physically predictive when generating model device structures. Additionally, by conducting virtual experiments in the virtual fabrication environment of the present invention, multiple device structure models may be generated using ranges of process parameters and design parameter variations to cover an entire process and design space of interest in a way not economically or physically feasible in a physical fabrication environment.

Figure 1:
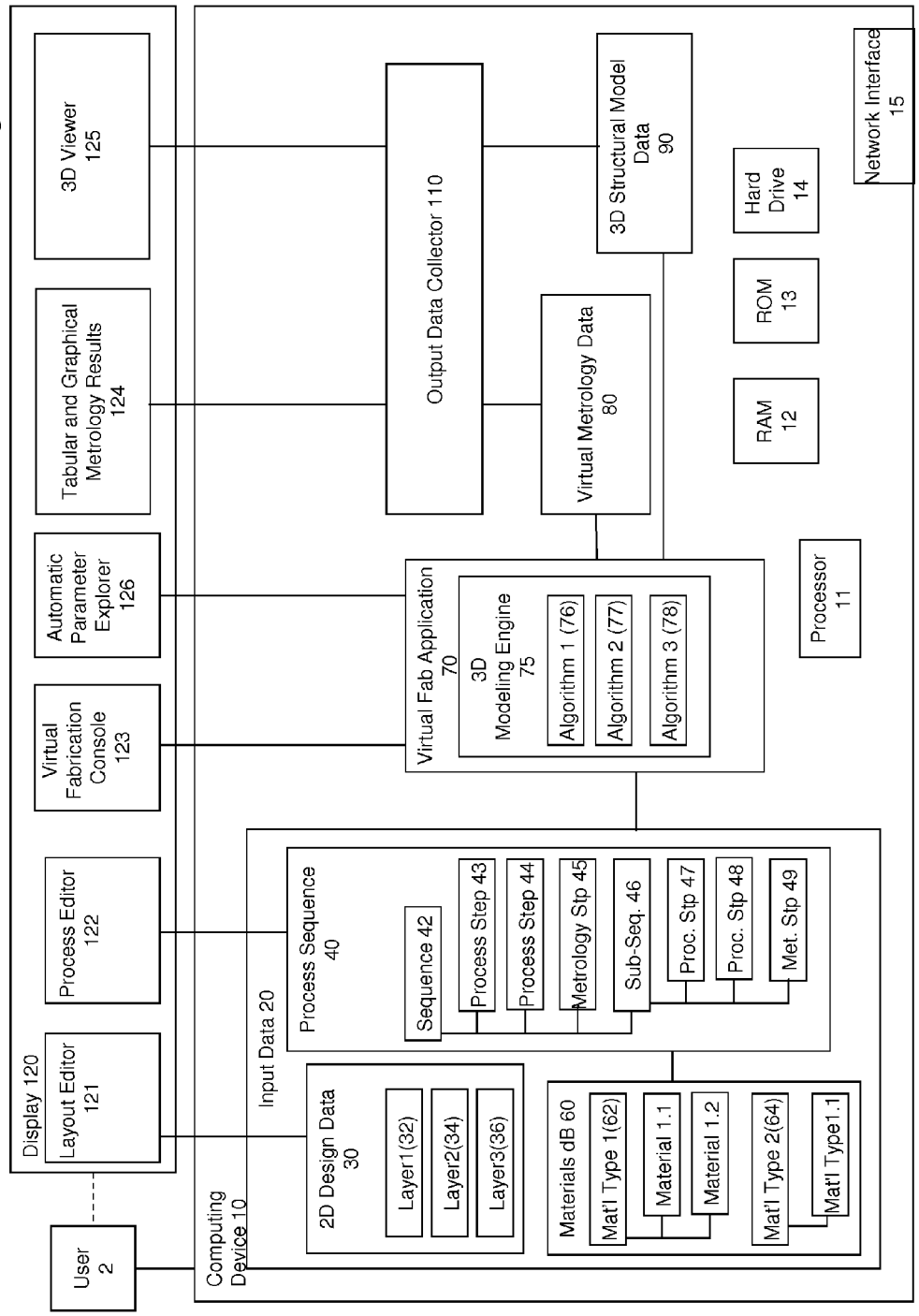
FIG. 1 depicts an exemplary virtual fabrication environment suitable for practicing an embodiment of the present invention.

FIG. 1 depicts an exemplary virtual fabrication environment 1 suitable for practicing an embodiment of the present invention. Virtual fabrication environment 1 includes a computing device 10 accessed by a user 2. Computing device 10 is in communication with a display 120. Display 120 may be a display screen that is part of computing device 10 or may be a separate display device or display surface in communication with computing device 10. Computing device 10 may be a PC, laptop computer, tablet computing device, server, or some other type of computing device equipped with a processor 11 and able to support the operations of 3D modeling engine 75 (described further below). The processor may have one or more cores. The computing device 10 may also include volatile and non-volatile storage such as, but not limited to, Random Access Memory (RAM) 12, Read Only Memory (ROM) 13 and hard drive 14. Computing device 10 may also be equipped with a network interface 15 so as to enable communication with other computing devices.

Computing device 10 may store and execute virtual fabrication application 70 including 3D modeling engine 75. 3D modeling engine 75 may include one or more algorithms such as algorithm 1 (76), algorithm 2 (77), and algorithm 3 (78) used in virtually fabricating semiconductor device structures. 3D modeling engine 75 may accept input data 20 in order to perform virtual fabrication "runs" that produce semiconductor device structural model data 90. Virtual fabrication application 70 and 3D modeling engine 75 may generate a number of user interfaces and views used to create and display the results of virtual fabrication runs. For example, virtual fabrication application 70 and 3D modeling engine 75 may display layout editor 121, process editor 122 and virtual fabrication console 123 used to create virtual fabrication runs. Virtual fabrication application 70 and 3D modeling engine 75 may also display a tabular and graphical metrology results view 124 and 3D view 125 for respectively displaying results of virtual fabrication runs and 3D structural models generated by the 3D modeling engine 75 during virtual fabrication of semiconductor device structures.

Input data 20 includes both 2D design data 30 and process sequence 40. Process sequence 40 may be composed of multiple process steps 43, 44, 47, 48 and 49. As described further herein, process sequence 40 may also include one or more virtual metrology measurement process steps 45. Process sequence 40 may further include one or more subsequences which include one or more of the process steps or virtual metrology measurement process steps. 2D design data 30 includes of one or more layers such as layer 1 (32), layer 2 (34) and layer 3 (36), typically provided in an industry-standard layout format such as GDS II (Graphical Design System version 2) or OASIS (Open Artwork System Interchange Standard).

Input data 20 may also include a materials database 60 including records of material types such as material type 1 (62) and material type 2 (64) and specific materials for each material type. Many of the process steps in a process sequence may refer to one or more materials in the materials database. Each material has a name and some attributes such as a rendering color. The materials database may be stored in a separate data structure. The materials database may have hierarchy, where materials may be grouped by types and sub-types. Individual steps in the process sequence may refer to an individual material or a parent material type. The hierarchy in the materials database enables a process sequence referencing the materials database to be modified more easily. For example, in virtual fabrication of a semiconductor device structure, multiple types of oxide material may be added to the structural model during the course of a process sequence. After a particular oxide is added, subsequent steps may alter that material. If there is no hierarchy in the materials database and a step that adds a new type of oxide material is inserted in an existing process sequence, all subsequent steps that may affect oxide materials must also be modified to include the new type of oxide material. With a materials database that supports hierarchy, steps that operate on a certain class of materials such as oxides may refer only to the parent type rather than a list of materials of the same type. Then, if a step that adds a new type of oxide material is inserted in a process sequence, there is no need to modify subsequent steps that refer only to the oxide parent type. Thus hierarchical materials make the process sequence more resilient to modifications. A further benefit of hierarchical materials is that stock process steps and sequences that refer only to parent material types can be created and re-used.

3D Modeling Engine 75 uses input data 20 to perform the sequence of operations/steps specified by process sequence 40. As explained further below, process sequence 40 may include one or more virtual metrology steps 45, 49 that indicate a point in the process sequence during a virtual fabrication run at which a measurement of a structural component should be taken. The measurement may be taken using a locator shape previously added to a layer in the 2D design data 30. In an alternative embodiment the measurement location may be specified by alternate means such as (x, y) coordinates in the 2D design data or some other means of specifying a location in the 2D design data 30 instead of through the use of a locator shape. The performance of the process sequence 40 during a virtual fabrication run generates virtual metrology data 80 and 3D structural model data 90. 3D structural model data 90 may be used to generate a 3D view of the structural model of the semiconductor device structure which may be displayed in the 3D viewer 125. Virtual metrology data 80 may be processed and presented to a user 2 in the tabular and graphical metrology results view 124.

Because of the large number of structural dimensions that are critical to the success of an integrated technology such as semiconductor devices, finding the relationship between the many inter-related process steps used to fabricate a device structure and the created structure is critical. As structural modifications produced by a step in the process sequence may be affected by previous and subsequent steps in the sequence, a particular step may affect a structural dimension in ways that are not obvious. Embodiments of the present invention provide a virtual fabrication environment that enables automatic extraction of structural measurements from the device being created. The automatic extraction of a measurement is accomplished by specifying a virtual metrology measurement step in the process sequence at a point in the process when the measurement is critical. A locator shape for this virtual metrology measurement can be added to a layer in the design data and specified by the virtual metrology measurement step. The output data from this virtual metrology measurement can be used to provide quantitative comparison to other modeling results or to physical metrology measurements. This virtual metrology measurement capability is provided by embodiments of the present invention during the processing sequence to extract a critical physical dimension at the correct point in the integrated process flow.

The ability to provide virtual metrology measurement data at specified locations in the device structure provides a significant improvement over conventional physical fab measuring techniques. Typically, physical in-fab measurements are done on specific characterization structures fabricated in the scribe lines or saw kerfs, adjacent to the product dice. In most cases, these characterization structures need to be designed to accommodate limitations of the measurement technique, such as optical spot size. Therefore, the characterization structures are not entirely representative of the actual structures on the product dice. Because of these differences, users of in-fab measurements usually face the challenge of inferring the result on the product structure from a measurement on a characterization structure. In the virtual fabrication environment of the present invention, measurements can be added to any design layout at specified points in the process sequence thus providing greater insight into the effect of the inter-related process steps on the virtual structural model being constructed. As such, the in-fab challenge of measuring a characterization structure and inferring the result on a product structure is eliminated.

Figure 2:
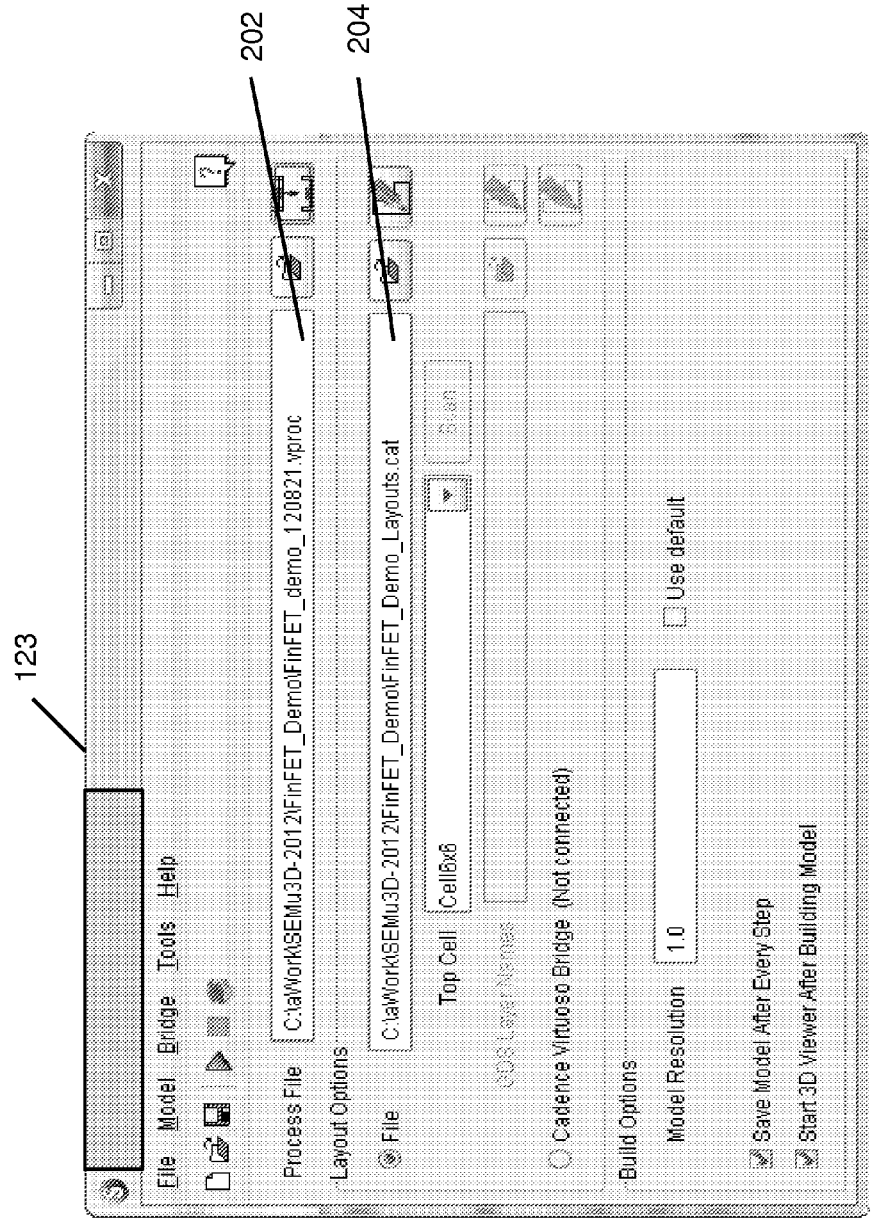
FIG. 2 depicts an exemplary virtual fabrication console utilized in an embodiment of the present invention.

FIG. 2 depicts an exemplary virtual fabrication console 123 utilized in an embodiment of the present invention to set up a virtual fabrication run. The virtual fabrication console 123 allows the user to specify a process sequence 202 and the layout (2D design data) 204 for the semiconductor device structure that is being virtually fabricated. It should be appreciated however that the virtual fabrication console can also be a text-based scripting console that provides the user with a means of entering scripting commands that specify the required input and initiate building of a structural model, or building a set of structural models corresponding to a range of parameter values for specific steps in the process sequence. The latter case is considered a virtual experiment (discussed further below).

Figure 3:
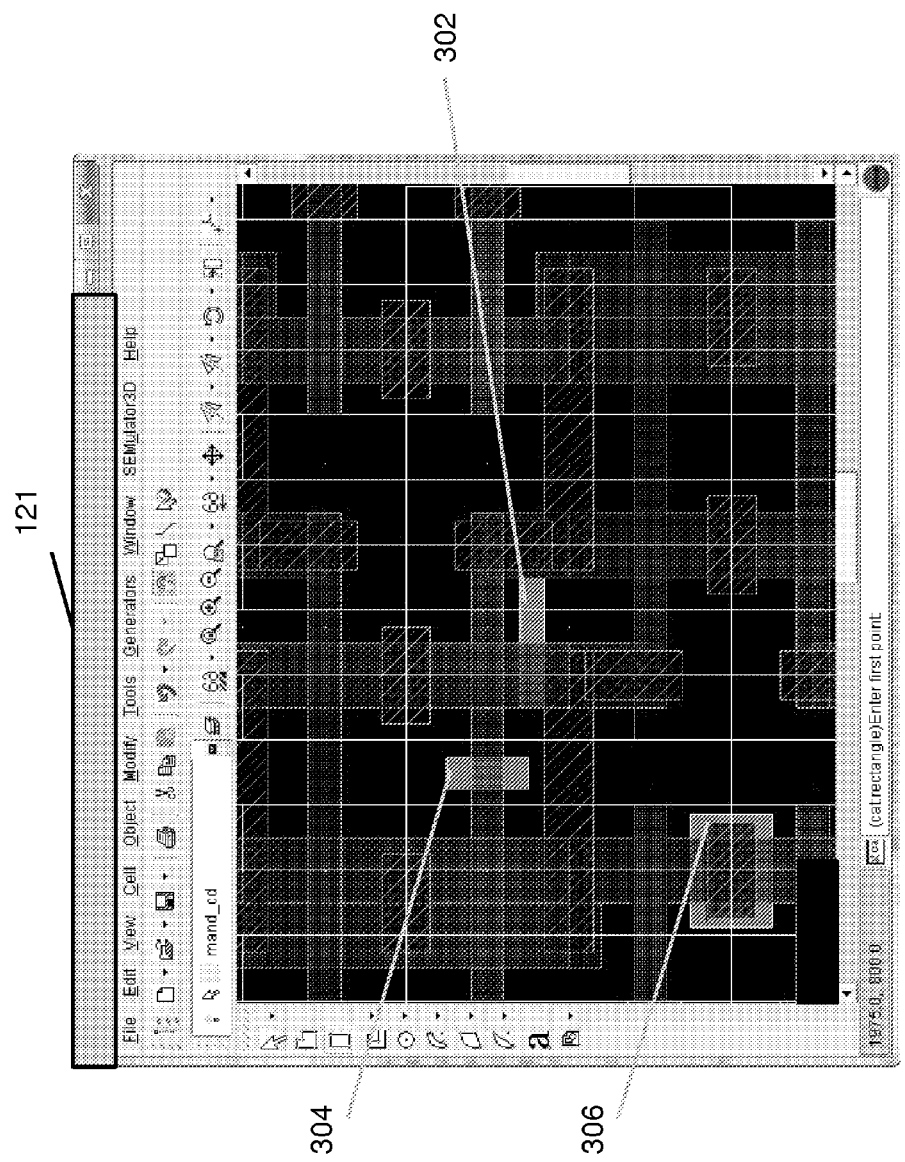
FIG. 3 depicts an exemplary layout editor utilized in an embodiment of the present invention.

FIG. 3 depicts an exemplary layout editor utilized in an embodiment of the present invention. The layout editor 121 displays the 2D design layout specified by the user in the virtual fabrication console 123 In the layout editor, color may be used to depict different layers in the design data. The areas enclosed by shapes or polygons on each layer represent regions where a photoresist coating on a wafer may be either exposed to light or protected from light during a photolithography step in the integrated process flow. The shapes on one or more layers may be combined (booleaned) to form a mask that is used in a photolithography step. The layout editor 121 provides a means of inserting, deleting and modifying a polygon on any layer, and of inserting, deleting or modifying layers within the 2D design data. A layer can be inserted for the sole purpose of containing shapes or polygons that indicate the locations of virtual metrology measurements. The rectangular shapes 302, 304, 306 have been added to an inserted layer (indicated by a different color) and mark the locations of virtual metrology measurements. As noted above, other approaches to specifying the locations for the virtual metrology measurements besides the use of locator shapes should also be considered within the scope of the present invention. The design data is used in combination with the process data and materials database to build a 3D structural model.

Figure 4:
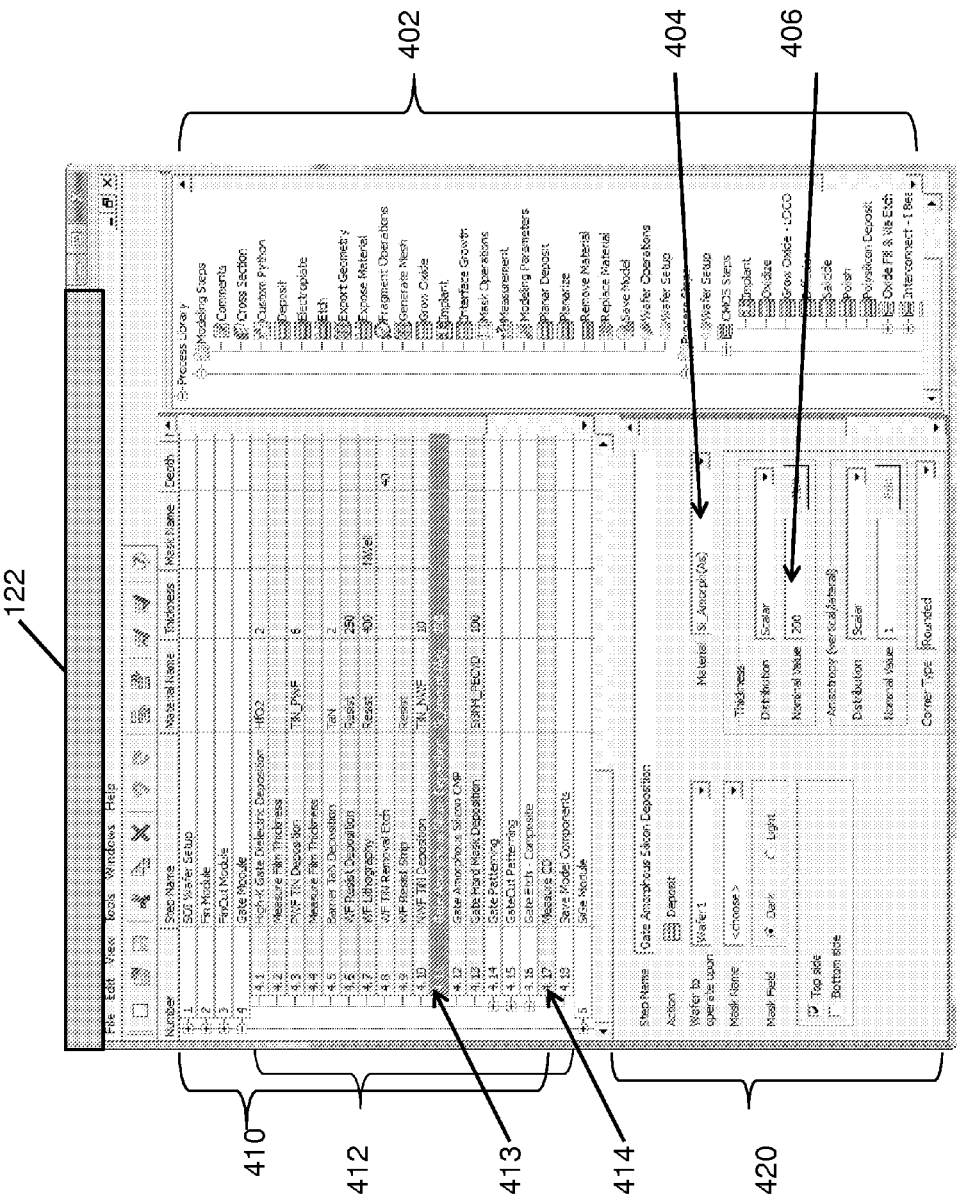
FIG. 4 depicts an exemplary process editor utilized in an embodiment of the present invention.

In embodiments of the present invention, inserted layers in the design data displayed in the layout editor 121 may include inserted locator shapes. For example, a locator shape may be a rectangle, the longer sides of which indicate the direction of the measurement in the 3D structural model. For example, in FIG. 3, a first locator shape 302 may mark a double patterning mandrel for virtual metrology measurement, a second locator shape 304 may mark a gate stack for virtual metrology measurement and a third locator shape 306 may mark a transistor source or drain contact for virtual metrology measurement FIG. 4 depicts an exemplary process editor 122 utilized in an embodiment of the present invention. The user defines a process sequence in the process editor. The process sequence is an ordered list of process steps conducted in order to virtually fabricate the user's selected structure. The process editor may be a text editor, such that each line or group of lines corresponds to a process step, or a specialized graphical user interface such as is depicted in FIG. 4. The process sequence may be hierarchical, meaning process steps may be grouped into sub-sequences and sub-sequences of sub-sequences, etc. Generally, each step in the process sequence corresponds to an actual step in the fab. For instance, a sub-sequence for a reactive ion etch operation might include the steps of spinning on photo resist, patterning the resist, and performing the etch operation. The user specifies parameters for each step or sub-step that are appropriate to the operation type. Some of the parameters are references to materials in the materials database and layers in the 2D design data. For example, the parameters for a deposit operation primitive are the material being deposited, the nominal thickness of the deposit and the anisotropy or ratio of growth in the lateral direction versus the vertical direction. This deposit operation primitive can be used to model actual processes such as chemical vapor deposition (CVD). Similarly, the parameters for an etch operation primitive are a mask name (from the design data), a list of materials affected by the operation, and the anisotropy.

There may be hundreds of steps in the process sequence and the process sequence may include sub-sequences. For example, as depicted in FIG. 4, a process sequence 410 may include a subsequence 412 made up of multiple process steps such as selected step 413. The process steps may be selected from a library of available process steps 402. For the selected step 413, the process editor 122 enables a user to specify all required parameters 420. For example, a user may be able to select a material from a list of materials in the material database 404 and specify a process parameter 406 for the material's use in the process step 413.

One or more steps in the process sequence may be virtual metrology steps inserted by a user. For example, the insertion of step 4.17 "Measure CD" (414), where CD denotes a critical dimension, in process sequence 412 would cause a virtual metrology measurement to be taken at that point in the virtual fabrication run using one or more locator shapes that had been previously inserted on one or more layers in the 2D design data. By inserting the virtual metrology steps directly in the fabrication sequence, the embodiment of the present invention allows virtual metrology measurements to be taken at critical points of interest during the fabrication process. As the many steps in the virtual fabrication interact in the creation of the final structure, the ability to determine geometric properties of a structure, such as cross-section dimensions and surface area, at different points in the integrated process flow is of great interest to the process developer and structure designer.

Figure 5:
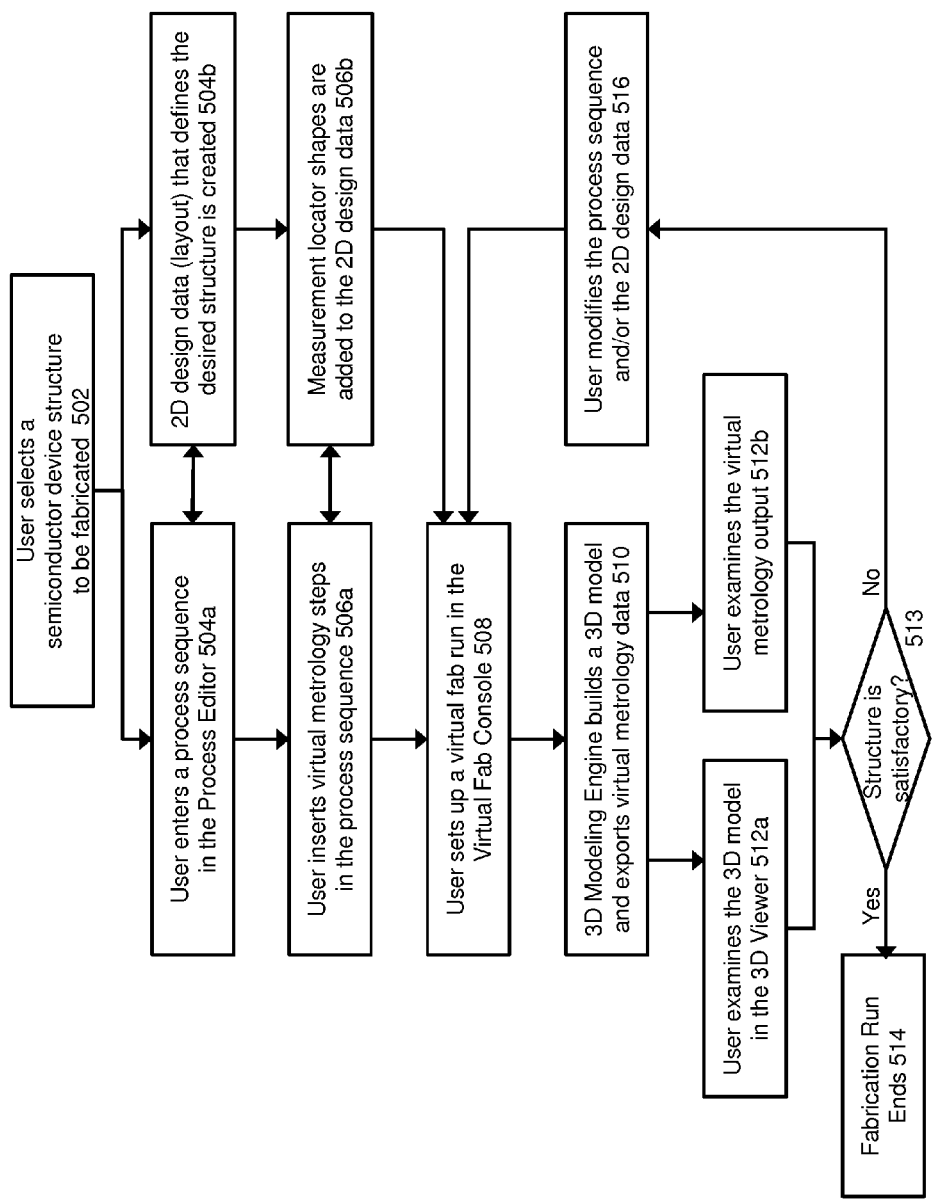
FIG. 5 depicts an exemplary sequence of steps followed by an embodiment of the present invention to generate virtual metrology measurement data.

FIG. 5 depicts an exemplary sequence of steps followed by an embodiment of the present invention to generate virtual metrology measurement data. The sequence begins with a user selecting a semiconductor device structure to be fabricated (step 502). The user may select from among multiple available sets of design data files and then select a rectangular region within the design data. For example the user may choose a FinFET or a passive resistor or a memory cell. Following the determination/selection of the structure to be fabricated, the user enters a process sequence in the process editor 122 (step 504a) and selects 2D design data that is expected to result in the desired structure (step 504b). Optionally, the user may create or modify design data in the layout editor 121. In the process editor, the user may insert one or more virtual metrology steps in the process sequence that specify a point during the virtual fabrication that the user would like virtual metrology measurements to be taken at specified locations in the evolving structure (step 506a). The user may insert locator shapes in the 2D design data displayed in the layout editor 121 that will be used by the virtual metrology step to perform its measurements (step 506b). The significance of a locator shape depends on the type of measurement requested. For example, the longer axis of a rectangular shape may indicate the direction and extent of a length measurement to be taken on a cross section of the structure, or the rectangle itself may designate a region where the contact area between two materials is to be measured. It will be appreciated that both above-described steps in the process editor may be performed before the steps in the layout editor or vice-versa without departing from the scope of the present invention.

After the one or more locator shapes have been added to one or more layers in the 2D design data (step 506b) and the virtual metrology step(s) have been added to the process sequence (506a) the user sets up a virtual fabrication run using the virtual fabrication console 123 (step (508). During the virtual fabrication run, the process steps in the process sequence 40 are performed in the order specified by the 3D modeling engine 75. When the virtual fabrication reaches the virtual metrology step, a virtual "measurement" of the specified component in the structure being fabricated is performed. The computations done by the modeling engine depend on the nature of the measurement being requested, and are generally consistent with the analogous physical measurement technique in the fab. For example, critical dimension scanning electron microscope (CD-SEM) measurements in the fab locate sidewalls by detecting rapid changes in the orientation of the top surface of a structure. Similarly in a virtual metrology operation, the 3D modeling engine extracts the top surface of the structure in the region specified by a locator rectangle, interrogates the surface along its intersection with a plane defined by the intersection of the longer axis of the rectangle and the vertical axis for changes in slope that exceed a threshold (5 degrees, for example). Large changes in slope define faces of a feature, such as the bottom, top and sides of a ridge in the structure. Having established the locations of bottom, top and sides of a feature, the distance between the sides of the feature is computed at a vertical location (bottom, middle, or top) specified by the metrology step. The 3D modeling engine generates one or more types of output as it builds structural models. One type of output is the structural model itself, and may include its state at one or more points in the process sequence. The 3D model may be displayed to a user in the 3D viewer 125 (step 512a). The 3D modeling engine also exports the virtual metrology data (step 510). The virtual metrology data 80 may be exported to a automatic data analysis tool for further processing or may be displayed to a user through a user interface such as the tabular and graphical metrology results view 124 or other view (step 512b). If the structure when viewed or analyzed is satisfactory (step 513), the virtual fabrication run ends (step 514). If the structure created by the 3D modeling engine is unsatisfactory, the user modifies the process sequence and/or the 2D design data (step 516) and a new virtual fabrication run is set up (step 508).

Figure 6:
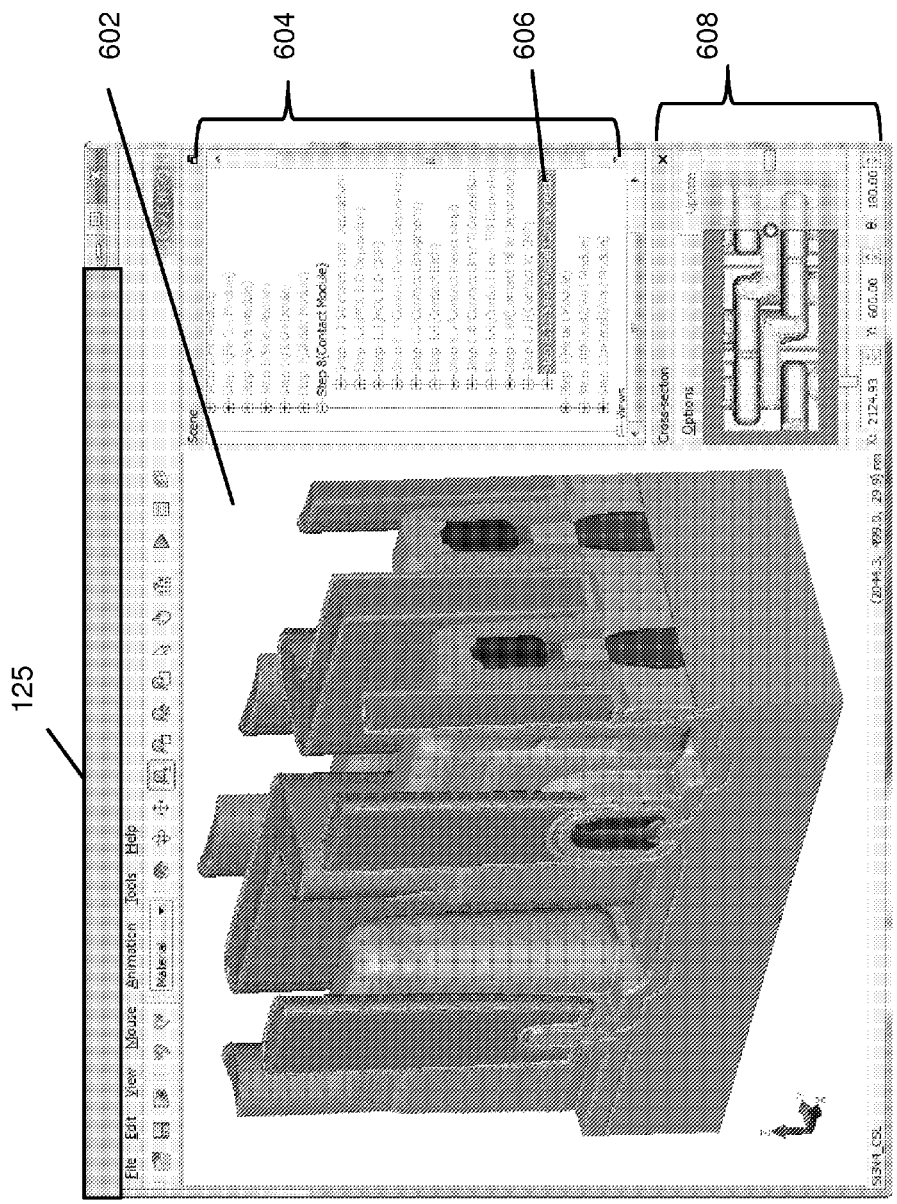
FIG. 6 depicts an exemplary 3D viewer utilized in an embodiment of the present invention.

FIG. 6 depicts an exemplary 3D viewer 125 utilized in an embodiment of the present invention. The 3D viewer 75 may include a 3D view canvas 602 for displaying 3D models generated by the 3D modeling engine 75. The 3D viewer 75 may display saved states 604 in the process sequence and allow a particular state to be selected 606 and appear in the 3D view canvas. The 3D Viewer provides functionality such as zoom in/out, rotation, translation, cross section, etc. Optionally, the user may activate a cross section view in the 3D view canvas 602 and manipulate the location of the cross section using a miniature top view 608.

Figure 7:
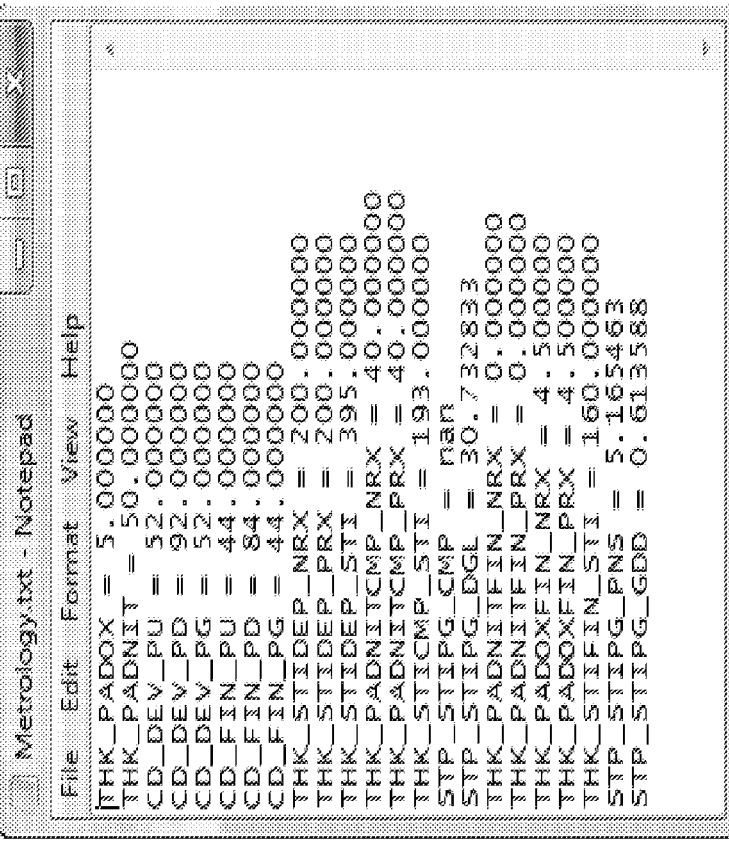
FIG. 7 depicts an exemplary display of virtual metrology measurement data generated by an embodiment of the present invention.

Another type of output from the 3D modeling engine 75 is the data produced by virtual metrology steps that are included in the process sequence. FIG. 7 depicts an exemplary display of virtual metrology measurement data 80 generated by multiple virtual metrology measurement steps in an embodiment of the present invention. The virtual metrology measurement result data 80 may be displayed in a tabular or graphical form including 2D X-Y plots and multi-dimensional graphics.

The techniques employed by the virtual fabrication system of the present invention are geometry-based. Calibration of the process step input parameters with actual experimental results from a physical fabrication to make virtual experiments more predictive is therefore advisable. Such calibration of the process steps results in improved modeling accuracy for all structures that comprise the full technology suite. Calibration can be executed on individual process steps from measurements, metrology or other physical characterization methods on characterization structures or product structures. Calibration may be conducted by comparing modeling results, including virtual metrology measurement data, to corresponding measurements or metrology conducted in the physical fab (on corresponding characterization or product structures), and subsequently adjusting modeling parameters such that the resulting virtually fabricated structures better match the physically fabricated structures. With proper calibration of modeling process parameters, the virtual fabrication environment of the present invention becomes more predictive of the structures that result from physical fabrication throughout the entire allowed design space.

Figure 8:
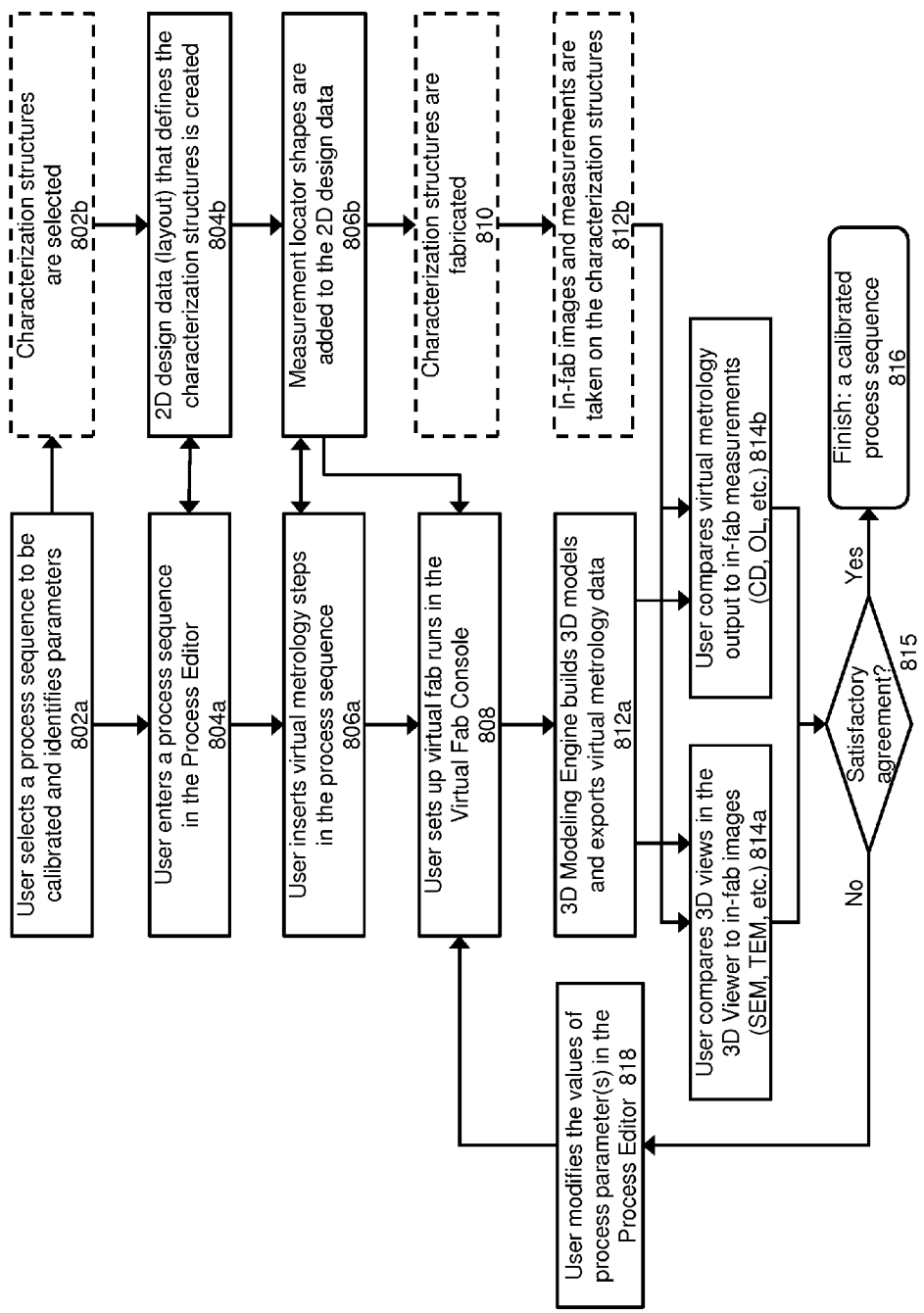
FIG. 8 depicts an exemplary sequence of steps followed by an embodiment of the present invention to calibrate a process sequence in a virtual fabrication environment.

FIG. 8 depicts an exemplary sequence of steps followed by an embodiment of the present invention to calibrate a process sequence in a virtual fabrication environment. The sequence includes steps taken in both a virtual fabrication environment and a corresponding physical fab environment. In the virtual fabrication environment, the user selects a process sequence (for a structure to be virtually fabricated) to be calibrated and identifies related process parameters (step 802a). In the physical fab the user identifies a set of characterization or product structures for measurement during a fabrication run (step 802b). Back in the virtual fabrication environment the user enters the process sequence in the process editor (step 804a) and the 2D design data (layout) that defines the characterization structures is selected from available 2D design data or created for the purpose in the layout editor 121 (step 804b) The same design data is used for virtual fabrication and actual characterization. As discussed above, the user inserts one or more virtual metrology steps in the process sequence (step 806a) and adds measurement locator shapes to the 2D design data (step 806b). The user sets up a virtual fab run in the virtual fabrication console (step 808) and the 3D modeling engine builds the 3D model, and generates and exports virtual metrology data (step 812a). In parallel or offset with the virtual fabrication run, the physical fabrication environment creates the characterization or product structures (step 810) and in-fab images and measurements are taken on these structures (step 812b). The user may then compare the 3D views of the generated virtual model in the 3D viewer 75 to the in-fab images of the physical device structure (step 814a). Further, the set of characterization structure measurements may be compared to the virtual metrology measurements taken as a result of the virtual metrology step being inserted into the process sequence (step 814b). In most cases, this comparison will be made by the user, but in an alternative embodiment the comparison may be made by an automated data analysis tool based on pre-defined or interactively solicited criteria. If there is satisfactory agreement between the views and images and the virtual and actual measurements (step 815), the process sequence is considered calibrated (step 816). However, if there is not satisfactory agreement (step 815), the user modifies the values of the process parameters in the process editor (step 818) and a new virtual fabrication run is set up in the virtual fabrication console (step 808). The sequence then iterates until a satisfactory agreement is reached and calibration is achieved.

It should be appreciated that there may be a number of different parameters that may be calibrated within the sequence. Further, although the above description notes the use of the insertion of virtual metrology steps in the process sequence and the related use of the 2D locator shape or shapes to conduct the virtual metrology measurements, the present invention is not limited thereto. For example, the virtual measurements could be conducted on a virtual device structure after fabrication is completed and then compared to the physical measurements taken of the characterization structures during/after the physical fabrication run.

While building a single structural model can be valuable, there is increased value in virtual fabrication that builds a large number of models. The embodiments of the present invention enable a user to create and run a virtual experiment. In a virtual experiment of the present invention, a range of values of process parameters can be explored. A virtual experiment may be set up by specifying a set of parameter values to be applied to individual processes (rather than a single value per parameter) in the full process sequence. A single process sequence or multiple process sequences can be specified this way. The 3D modeling engine 75, executing in virtual experiment mode, then builds multiple models spanning the process parameter set, all the while utilizing the virtual metrology measurement operations described above to extract metrology measurement data for each variation. This capability provided by the embodiments of the present invention may be used to mimic two fundamental types of experiments that are typically performed in the physical fab environment. Firstly, fabrication processes vary naturally in a stochastic (non-deterministic) fashion. As explained herein, embodiments of the present invention use a fundamentally deterministic approach for each virtual fabrication run that nevertheless can predict non-deterministic results by conducting multiple runs. The virtual experiment mode provided by an embodiment of the present invention allows the virtual fabrication environment to model through the entire statistical range of variation for each process parameter, and the combination of variations in many/all process parameters. Secondly, experiments run in the physical fab may specify a set of parameters to be intentionally varied when fabricating different wafers. The virtual experiment mode of the present invention enables the Virtual Fabrication Environment to mimic this type of experiment as well, by performing multiple virtual fabrication runs on the specific variations of a parameter set.

Each process in the fabrication sequence has its own inherent variation. To understand the effect of all the aggregated process variations in a complex flow is quite difficult, especially when factoring in the statistical probabilities of the combinations of variations. Once a virtual experiment is created, the process sequence is essentially described by the combination of numerical process parameters included in the process description. Each of these parameters can be characterized by its total variation (in terms of standard deviation or sigma values), and therefore by multiple points on a Gaussian distribution or other appropriate probability distribution. If the virtual experiment is designed and executed to examine all of the combinations of the process variations (multiple points on each Gaussian, for example the ±3 sigma, ±2 sigma, ±1 sigma, and nominal values of each parameter), then the resulting graphical and numerical outputs from virtual metrology steps in the sequence cover the total variation space of the technology. Even though each case in this experimental study is modeled deterministically by the virtual fabrication system, the aggregation of the virtual metrology results contains a statistical distribution. Simple statistical analysis, such as Root Sum Squares (RSS) calculation of the statistically uncorrelated parameters, can be used to attribute a total variation metric to each case of the experiment. Then, all of the virtual metrology output, both numerical and graphical, can be analyzed relative to the total variation metric.

In typical trial-and-error experimental practice in a physical fab, a structural measurement resulting from the nominal process is targeted, and process variations are accounted for by specifying an overly large (conservative) margin for the total variation in the structural measurement (total structural margin) which must be anticipated in subsequent processes. In contrast, the virtual experiment embodiments of the present invention can provide quantitative predictions of the total variation envelope for a structural measurement at any point in the integrated process flow. The total variation envelope, rather than the nominal value, of the structural measurement may then become the development target. This approach can ensure acceptable total structural margin throughout the integrated process flow, without sacrificing critical structural design goals. This approach, of targeting total variation may result in a nominal intermediate or final structure that is less optimal (or less aesthetically pleasing) than the nominal structure that would have been produced by targeting the nominal process. However, this sub-optimal nominal process is not critical, since the envelope of total process variation has been accounted for and is more important in determining the robustness and yield of the integrated process flow. This approach is a paradigm shift in semiconductor technology development, from an emphasis on the nominal process to an emphasis on the envelope of total process variation.

Figure 9:
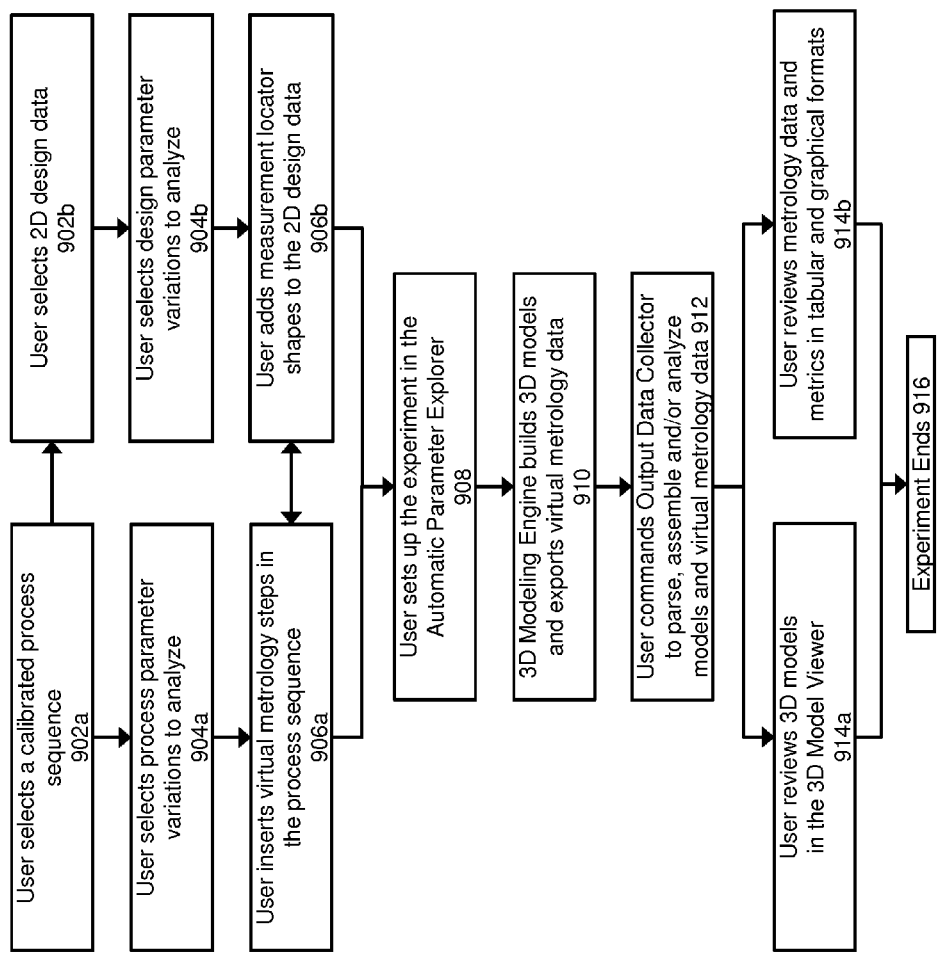
FIG. 9 depicts an exemplary sequence of steps followed by an embodiment of the present invention to set up and perform a virtual experiment generating virtual metrology measurement data for multiple semiconductor device structure models.
Figure 10:
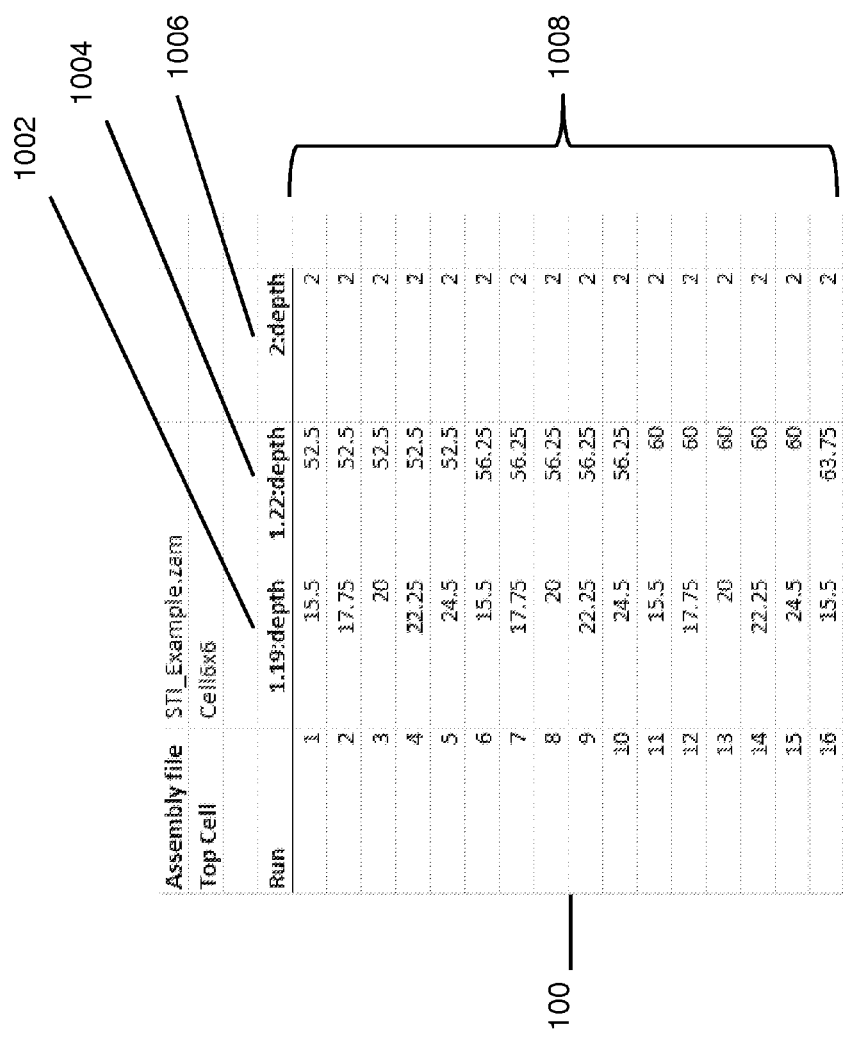
FIG. 10 depicts an exemplary parameter explorer view used to provide process parameters for a virtual experiment in an embodiment of the present invention.

FIG. 9 depicts an exemplary sequence of steps followed by an embodiment of the present invention to set up and perform a virtual experiment generating virtual metrology measurement data for multiple semiconductor device structural models. The sequence begins with a user selecting a process sequence (which may have been previously calibrated to make the results more structurally predictive (step 902a) and identifying/creating 2D design data (step 902b). The user may select process parameter variations to analyze (step 904a) and/or design parameter variations to analyze (step 904b). The user inserts one or more virtual metrology steps in the process sequence as set forth above (step 906a) and adds measurement locator shapes to the 2D design data (step 906b). The user may set up the virtual experiment with the aid of a specialized user interface, an automatic parameter explorer 126 (step 908). An exemplary automatic parameter explorer is depicted in FIG. 10 and may display, and allow the user to vary, the process parameters to be varied 1002, 1004, 1006 and the list of 3D models to be built with their corresponding different parameter values 1008. The parameter ranges for a virtual experiment can be specified in a tabular format. The 3D modeling engine 75 builds the 3D models and exports the virtual metrology measurement data for review (step 910). The virtual experiment mode provides output data handling from all Virtual Measurement/Metrology operations. The output data from the virtual metrology measurements may be parsed and assembled into a useful form (step 912).

With this parsing and assembling, subsequent quantitative and statistical analysis can be conducted. A separate output data collector module 110 may be used to collect 3D model data and virtual metrology measurement results from the sequence of virtual fabrication runs that comprise the virtual experiment and present them in graphical and tabular formats. FIG. 11 depicts an exemplary tabular-formatted display of virtual metrology data generated by a virtual experiment in an embodiment of the present invention. In the tabular formatted display, the virtual metrology data collected during the virtual experiment 1102 and the list of virtual fabrication runs 1104 may be displayed.

Figure 12:
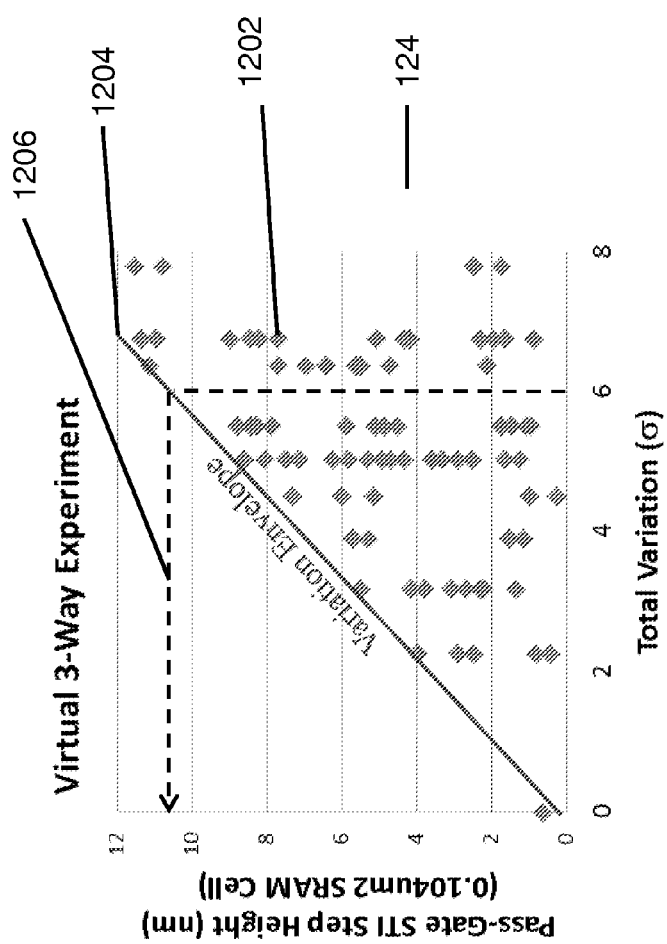
FIG. 12 depicts an exemplary graphical display of virtual metrology data generated in a virtual experiment in an embodiment of the present invention.

FIG. 12 depicts an exemplary 2D X-Y graphical plot display of virtual metrology data generated by a virtual experiment in an embodiment of the present invention. In the example depicted in FIG. 10, the total variation in shallow trench isolation (STI) step height due to varying 3 parameters in preceding steps of the process sequence is shown. Each diamond 1202 represents a virtual fabrication run. The variation envelope 1204 is also displayed as is the depicted conclusion 1206 that the downstream process modules must support approximately 10.5 nm of total variation in STI step height to achieve robustness through 6 sigma of incoming variation. The virtual experiment results can also be displayed in multi-dimensional graphic formats.

Once the results of the virtual experiment have been assembled, the user can review 3D models that have been generated in the 3D viewer (step 914*a*) and review the virtual metrology measurement data and metrics presented for each virtual fabrication run (step 914*b*). Depending on the purpose of the virtual experiment, the user can analyze the output from the 3D modeling engine for purposes of developing a process sequence that achieves a desired nominal structural model, for further calibrating process step input parameters, or for optimizing a process sequence to achieve a desired process window.

The 3D modeling engine's 75 task of constructing multiple structural models for a range of parameter values (comprising a virtual experiment) is very compute intensive and therefore could require a very long time (many days or weeks) if performed on a single computing device. To provide the intended value of virtual fabrication, model building for a virtual experiment must occur many times faster than a physical experiment. Achieving this goal with present day computers requires exploiting any and all opportunities for parallelism. The 3D modeling engine 75 of the present invention uses multiple cores and/or processors to perform individual modeling steps. In addition, the structural models for different parameter values in a set are completely independent and can therefore be built in parallel using multiple cores, multiple processors, or multiple systems.

In an illustrative embodiment, the 3D modeling engine 75 represents the underlying structural model in the form of voxels. Voxels are essentially 3D pixels. Each voxel is a cube of the same size, and may contain one or more materials, or no materials. Most of the operations performed by the 3D modeling engine in the embodiment are voxel modeling operations. Those skilled in the art will recognize that the 3D modeling engine 75 may also represent the structural model in other formats. For instance, the 3D modeling engine could use a conventional NURBS-based solid modeling kernel such as is used in 3D mechanical CAD tools, although modeling operations based on a digital voxel representation are far more robust than the corresponding operations in a conventional analog solid modeling kernel. Such solid modeling kernels generally rely on a large number of heuristic rules to deal with various geometric situations, and modeling operations may fail when the heuristic rules do not properly anticipate a situation. Aspects of semiconductor structural modeling that cause problems for NURBS-based solid modeling kernels include the very thin layers produced by deposition processes and propagation of etch fronts that results in merging faces and/or fragmentation of geometry.

In another embodiment, a multi-etch process may be included in the process sequence which allows the 3D modeling engine 75 to model a wide-range of process and material-specific etch behavior. Patterning operations in process flows for highly scaled semiconductor devices are frequently performed using plasma etches. Plasma etches are known by many different names: dry etch, reactive ion etch (RIE), inductively coupled plasma (ICP) etch, etc. A wide variety of operating conditions and chemistry allows process engineers to fine-tune plasma etch behavior to selectively achieve diverse etch physics in multiple different classes of materials. This behavioral flexibility is key to achieving a desired 3D structure when patterning through several layers of material. Several different types of physics are typically involved, including but not limited to: chemical etching, sputtering, deposition or re-deposition of polymeric material, electrostatic charging, electrostatic focusing, and shadowing. This diverse spectrum of physics produces a commensurate range of etch behavior and hence structural shapes.

Directly simulating of the physics involved in plasma etches with sufficient accuracy is extremely difficult and slow. The multi-etch process step of the present invention avoids the difficulties of physics-based simulations by simulating plasma etches using a reduced set of behavioral parameters that are specific to the type of etch and the material being etched. This allows the capture of a wide range of physical etch behavior without the need to directly simulate the physics of the etch process. Three main types of etch behavior may be simulated by an embodiment of the present invention: isotropic, taper, and sputtering. A fourth type of etch behavior, shadowing, can optionally also be simulated.

Basic (isotropic) behavior is caused (physically) by chemical etching and results in material being removed at a similar rate in all directions from the point on the etchable surface, regardless of the local orientation of the etchable surface. Basic behavior may be modeled with a single input parameter, "lateral ratio", that controls the ratio between the lateral and vertical etch rates. For example, a lateral ratio value of one (1.0) indicates that the etch rate is uniform in all directions. A lateral ratio value less than one indicates that the etch rate in the lateral direction (on vertical surfaces) is slower than the etch rate in the vertical direction (on horizontal surfaces).

Taper behavior is caused (physically) by a combination of directional etch behavior and polymer deposition. The polymer deposition occurs as a side effect of a directional etch process. During a directional etch process that etches horizontal surfaces much faster than vertical surfaces, polymer may accumulate on near-vertical surfaces. This competition between etching and deposition results in tapered sidewall profiles. Taper behavior may be modeled with a single input parameter, the taper angle. A taper angle describes the critical angle at which deposition and etch rates are balanced. An optional second parameter, the lateral ratio, has the same meaning as defined above for basic behavior.

Sputter behavior refers to direct physical removal of material through bombardment by energetic ions and results in preferential removal of protruding edges (convex edges) and in some cases corners. Sputtering may be modeled with two parameters: the angle of maximum sputter yield, and the rate of sputter relative to the rate of vertical etching.

Shadowing refers to a reduction in directional ion flux caused by a local elevation change, effectively reducing etch rates for some structures. This effect can be significant in some cases, resulting in differing etch rates across a cell. Shadowing may be modeled using a single parameter to describe angle of incidence of the energetic ions relative to a vertical axis.

FIG. 13A-C depict the effect of isotropic, taper and sputter etching behavior, respectively, simulated by the multi-etch process of the present invention. In FIG. 13A isotropic behavior is depicted showing an exemplary schematic cross-section of a device structure before the etch operation on the left side and the structure after the operation on the right side. An etchable material surface 1302 holds a masking material 1304. Masking material 1304 is material that etches relatively slowly. The effect of the istotropic behavior is to create an etch depth 1306 (shown between the vertical facing arrows) and a lateral etch distance (also known as an "etch bias") 1308 (shown between the horizontal facing arrows. The lateral ratio determines the ratio between the lateral etch distance 1308 and the etch depth 1306 in an embodiment of the present invention.

In FIG. 13B, the effect of taper behavior on a device structure is depicted. An etchable material surface 1302 holds a masking material 1304. The effect of the taper behavior is to a sidewall angle 1310 and optionally a lateral etch distance 1308. As noted above, this taper behavior may be simulated with just a single input parameter, the taper (sidewall) angle 1310 and may optionally use the lateral ratio input parameter to determine the ratio between the lateral etch distance 1308 and the etch depth 1306.

In FIG. 13C, the effect of sputter behavior on a device structure is depicted. An etchable material surface 1302 holds a sputter material 1320. The effect of sputter behavior is shown on the right of FIG. 13C. It should be appreciated that the material under the sputter material may be etched with any etch type (the effect of tapering is shown). As noted above, the sputter behavior may be simulated with two parameters: the angle of maximum sputter yield 1313, and the rate of sputter relative to the rate of vertical etching (sputter ratio). The sputter ratio determines the sputter distance 1312 relative to the etch depth 1306. The lateral ratio input parameter may optionally be used to model a lateral etch component and if used, determines the lateral etch distance 1308 relative to the etch depth 1306.

It should be noted that there are many alternate ways to express the set of parameters shown in FIGS. 13A-C that are within the scope of the present invention. For example, a sidewall angle may be measured relative to the horizontal instead of vertical. A lateral etch distance may be expressed as a dimensional distance rather than a ratio. It should also be noted that etches may equivalently be described using rates and times instead of depths and ratios.

Figure 14C:
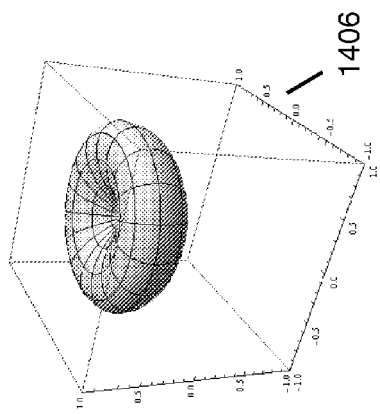
FIGS. 14A-C depict exemplary empirically determined single-material speed functions utilized by an embodiment of the present invention to define the etch speed as a function of local surface orientation.
Figure 14A:
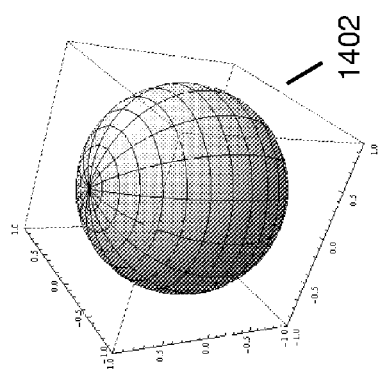
Figure 14B:
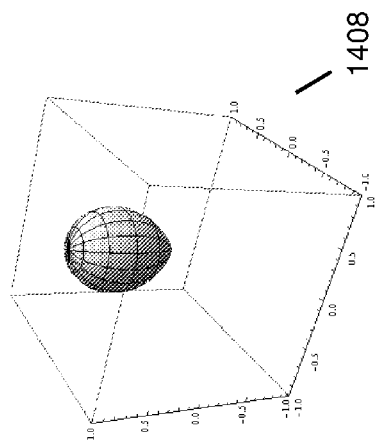

To model a multi-material, multi-physics etch, the input parameters described above must be formed into a suitable numerical modeling algorithm in the embodiment of the present invention. The numerical modeling algorithm of the present invention includes single material and multi-material speed functions and a surface evolution technique. A single-material speed function defines the etch speed as a function of local surface orientation (ie, surface normal direction) and is determined empirically in order to produce the desired etch behavior. For certain etch behavior, the speed function is trivial; for example, the speed function for isotropic etching is a constant. FIGS. 14A-C depict exemplary empirically-determined single-material speed functions utilized by an embodiment of the present invention to define the etch speed as a function of local surface orientation. The speed functions are depicted in the form of 3D polar plots. Examples of single-material speed functions for isotropic 1402, taper 1404 and sputter 1406 etching behavior are shown. The speed function for isotropic etching 1402 is a trivial constant. The speed functions for taper etches 1404 and sputter etches 1406 are empirically determined to achieve the desired etch behavior. Note that to model the effects of shadowing, the speed function must also take into account the visibility of the local surface to the ion source. Note also that a single-material speed function may combine multiple types of etch behavior; for example, both taper and sputter etching include the parameters associated with basic (isotropic) etching. A multi-material speed function is a combination of single-material speed functions, and calculates the local etch speed as a function of both local surface orientation and local material type. The Etch Ratio parameter defines the relative etch rates of etchable materials and is a multiplication factor on the single-material speed.

With the speed function defined, a suitable surface evolution technique may be used to locate and evolve the position of the etchable surface in three dimensions. The etchable surface is advected or moved in its local normal direction according to the local scalar speed determined by evaluating the speed function. The scalar speed must be calculated at points of interest on the etchable surface and must be periodically re-calculated as the geometry of the etchable surface evolves.

A number of different types of surface evolution techniques may be utilized by the numerical algorithm for simulating the multi-etch process of the present invention. The moving surface may be represented using any suitable numerical spatial discretization. Explicit front tracking methods may be used: examples include string methods, point-and-line methods (2D) and polygon surfaces (3D). An alternate implicit surface representation, such as distance fields, volume of fluid or voxels, may also be used. Any suitable time-dependent numerical technique may be used to advance the moving surface in time.

When applied to a multi-material etch, in combination with control of relative etch rates of all etchable materials, the techniques described above are capable of accurately and realistically modeling a very wide range of etch behavior and resultant structural shapes. This provides in a virtual fabrication system a semi-physical approach to simulating multi-material etches based on a relatively small set of input parameters that characterize the etch behavior.

Figure 15A:
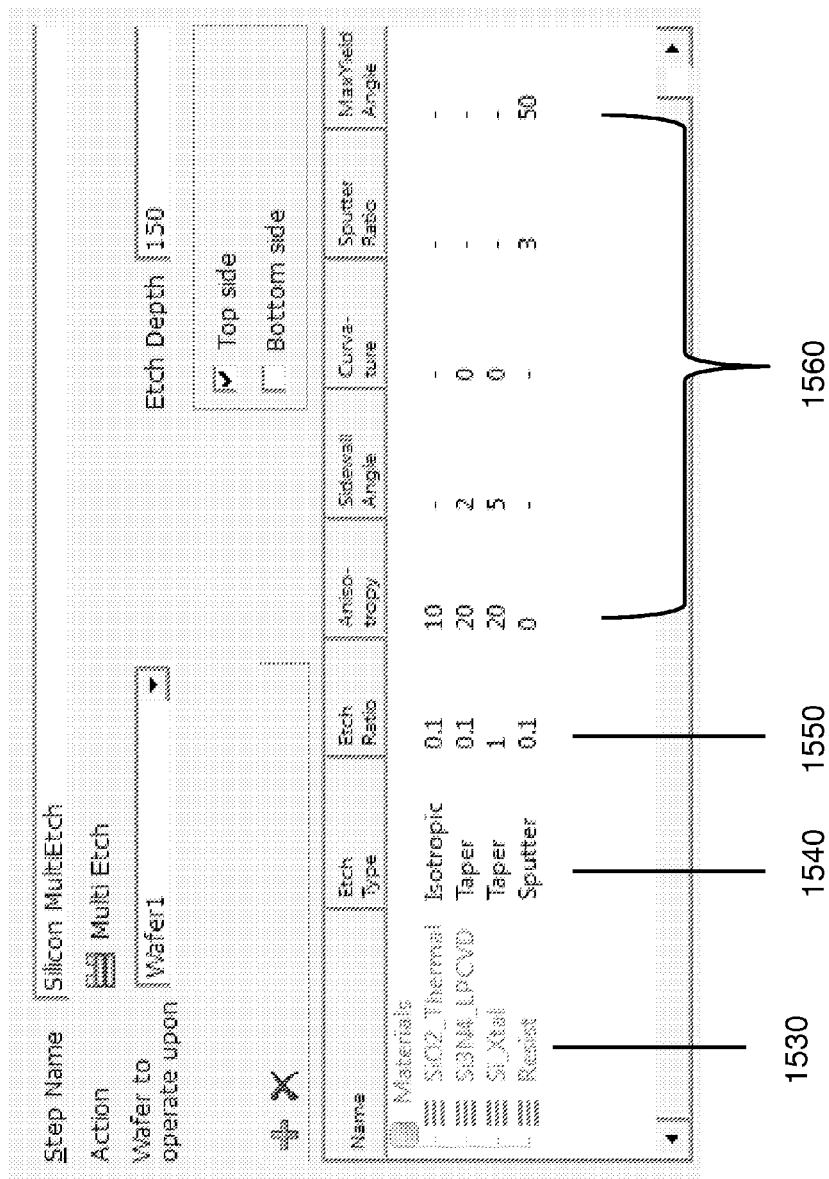
FIG. 15A depicts an exemplary process editor displaying information about a multi-etch process step.

FIGS. 15A-C depict parameters for an exemplary multi-etch step and related before 1510 and after 1520 3D structural models generated by the virtual fabrication system performing the multi-etch process step of the present invention. With respect to FIG. 15A, the displayed multi-etch process step 122 includes listed materials 1530, etch types 1540 associated with each material and an etch ratio 1550 for the relative etch rates of etchable materials. All these parameters, in combination with the individual parameters 1560, define the behavior of the etch. FIG. 15B shows a 3D view of a model 1510 before a multi-etch process of the present invention is applied to the structure. The model structure may have been produced in a virtual fabrication run as described above. FIG. 15C shows the effect of performing the multi-etch process on the model structure 1520. The model structure 1520 after the multi-etch process is applied shows a realistic erosion of photo resist due to sputtering 1521. The model structure 1520 also depicts the effects of a true taper etch that has created a well-defined side wall angle. The model structure additionally shows how the edges of the nitride material 1523 round off as resist is sputtered away and etch bias control (undercut) 1524 that is independent of sidewall angle. The 3D viewer 125 may be used to show the before and after models 1510 and 1520 from a number of different viewpoints.

Figure 16:
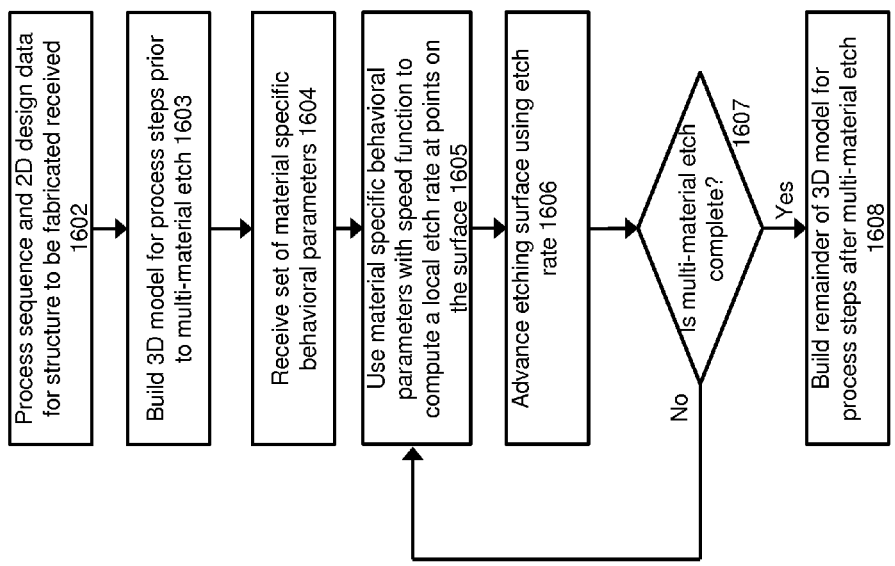
FIG. 16 depicts an exemplary sequence of steps followed by an embodiment of the present invention to create and perform a multi-etch process step in a virtual fabrication environment.

FIG. 16 depicts an exemplary sequence of steps followed by an embodiment of the present invention to create and perform a multi-etch process step in a virtual fabrication environment. The sequence begins by receiving a selection of 2D design data and a process sequence for a semiconductor structure to be virtually fabricated (step 1602). A virtual fabrication run builds process steps prior to the multi-etch step, creating a 3D model containing an etchable surface (1603). A set of material-specific behavioral parameters for one or more types of etch behavior to be applied to an etchable material in at least one etch process in the process sequence is also received (step 1604), and are used by the speed function to compute the local etch speed at required points on the etchable surface (step 1605). The virtual fabrication run uses the local etch rate to evolve or advance the etchable surface using a suitable numerical technique (step 1606). As the geometry of the etchable surface evolves, the etch speed must be periodically re-computed. The etch surface is advanced in this manner until the desired etch end-point is reached (step 1607). Upon completion of the multi-etch step, additional process steps are performed by the virtual fabrication run to complete the process sequence (1608).

In another embodiment, a selective epitaxy process may be included in a process sequence used to virtually fabricate a semiconductor device structure. The selective epitaxy process virtually models epitaxial growth of a crystalline material layer on top of a crystalline substrate surface of a semiconductor device structure. Selective epitaxy is widely used in contemporary semiconductor process flows, often for the purpose of imparting mechanical stress on the transistor channel to improve performance. A key characteristic of epitaxial growth is its dependence on crystal directions. Semiconductor devices are normally fabricated on single crystal silicon wafers; ie, silicon material with atoms arranged in a repetitive crystal lattice structure that is continuous over the majority of the wafer. Silicon crystal structure is anisotropic (ie, not symmetric in all directions), and silicon surfaces are more stable in several particular crystal directions. These directions are defined by the major crystal plane families, identified as <100>, <110> and <111> using their Miller indices, and have the strongest impact on growth characteristics. By varying the pressure, temperature and chemical precursors in the epitaxy process, engineers can control the relative growth rates of the three major planes. Growth rates on minor planes, for example <211>, <311>, <411>, also vary but often are not influential in determining the final shape of an epitaxially grown structure.

An embodiment of the present invention uses a surface evolution algorithm to model epitaxial growth. The surface upon which epitaxial growth is occurring (the growing surface) is advected or moved according to a scalar advection speed. The growth rate is calculated at selected points based on the local surface normal direction and fixed input parameters, is local in both distance and time, and moves the surface in its normal direction. The growing surface may be represented using any suitable numerical spatial discretization. Explicit front tracking methods may be used: examples include string methods, point-and-line methods (2D) and polygon surfaces (3D). An alternate implicit surface representation, such as distance functions, volume of fluid or voxels, may also be used. Any suitable time-dependent numerical technique may be used to advance the growing surface in time.

The selective epitaxy process of the present invention utilizes the growth rates of the three major plane families, <100>, <110> and <111> as fixed input parameters. These input parameters define the growth rate for surfaces that are aligned with any one of their associated planes. Further input parameters may include growth rates on neighboring non-crystalline materials. The relationship between the 3D modeling coordinate system and the crystal lattice of the wafer may also be considered when calculating the epitaxial growth rate. The 3D modeling coordinate system normally uses the same X and Y axes as the 2D design data and the Z axis is normally perpendicular to the surface of the wafer. Alternate coordinate systems are possible within the scope of the present invention. On a real wafer, the orientation of the crystal lattice is indicated by a "flat" or "notch" on the edge of the otherwise circular wafer. The notch may be used as a reference to orient the 2D design data in the desired direction relative to the crystal lattice. In an embodiment, input parameters specifying the notch (or flat) type and direction define the orientation of the crystal lattice and associated crystal planes of the wafer relative to the 2D design data. It should be noted that this relationship can be described as a coordinate transformation between the 3D model coordinate system and the coordinate system of the crystal lattice.

Using the growth rates for the major plane families and knowing the orientation of the crystal lattice, the epitaxial growth rate may be calculated everywhere on the growing surface by an embodiment of the present invention. Areas of the growing surface with a normal direction that is aligned with a major plane direction are assigned the speed of that major plane. For areas of the growing surface that are not aligned with a major plane direction, an appropriate speed must be found by interpolating between neighboring major plane directions. Further, the behavior of the epitaxial growth at the boundaries of the crystalline material can also be important. Epitaxial growth is often performed after several prior processing steps in which non-crystalline materials have been deposited and patterned. These non-crystalline materials may be adjacent to crystalline material and hence in close proximity to epitaxial growth. Examples of non-crystalline neighboring materials are silicon dioxide, silicon nitride, or any other materials common in semiconductor processing. In some cases, epitaxial growth slowly creeps along adjacent non-crystalline material (overgrowth) but in other cases it does not. Overgrowth behavior may be modeled with fixed input parameters defining the set of neighboring materials on which overgrowth occurs (overgrowth materials), as well as the speed at which the growing surface creeps along the overgrowth materials. The overgrowth speed modifies the epitaxial growth rate at the surface of the overgrowth materials such that the growing surface moves along the overgrowth material at the specified speed. In addition, the speed at which the growing surface moves along the overgrowth material may depend on the angle between the overgrowth material surface and the growing surface. In an embodiment, the overgrowth speed may be ignored if the angle between the two surfaces is greater than a threshold angle.

Figure 17:
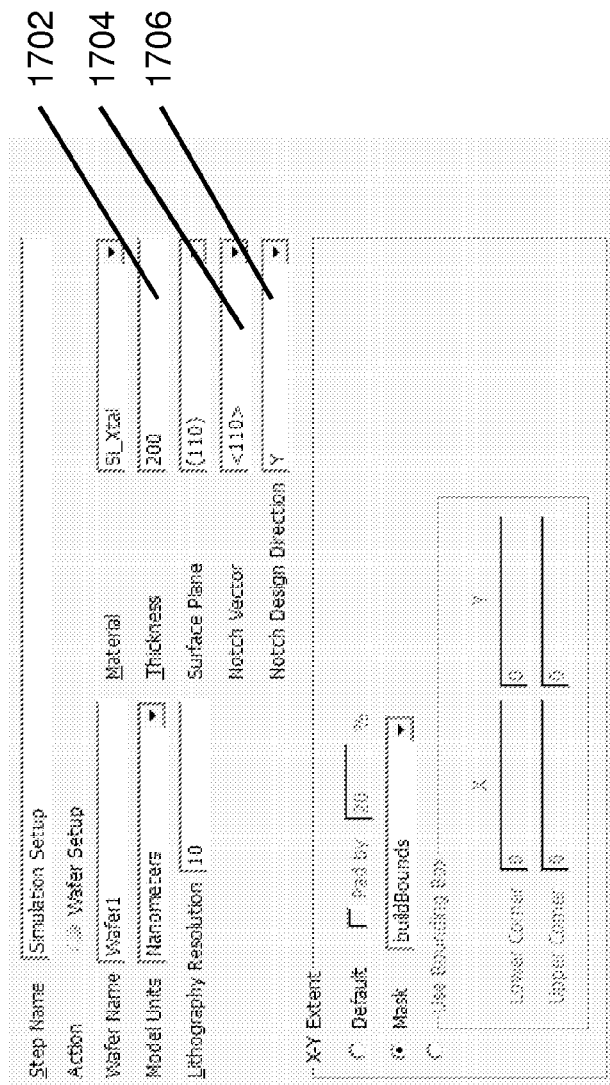
FIG. 17 depicts an exemplary process editor displaying input parameters for a silicon wafer that defines the orientation of the crystalline lattice within the wafer relative to the 3D coordinate system used in the virtual fabrication environment of the present invention.

FIG. 17 depicts an exemplary process editor displaying input parameters for a silicon wafer that defines the orientation of the crystalline lattice within the wafer relative to the 3D coordinate system used in the virtual fabrication environment of the present invention. The crystalline orientation has an essential impact on subsequent selective epitaxy processes. The process editor accepts input defining parameters associated with the silicon wafer. The input parameters surface plane 1702, notch vector 1704 and notch design direction 1706 together define the orientation of the crystalline lattice relative to the 3D model coordinate system.

Figure 18A:
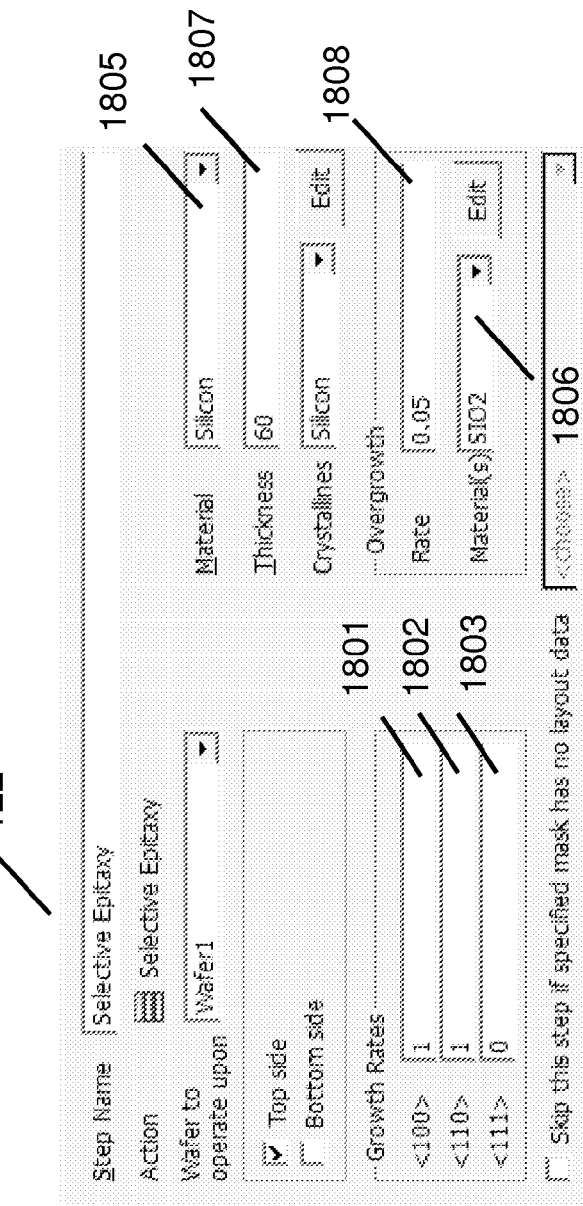
FIG. 18A depicts an exemplary process editor displaying information about a selective epitaxy process step modeling growth of crystalline materials.
Figure 18C:
FIGS. 18B-18C depict a 3D graphic that shows the etch rate for all possible orientations of the etchable surface, and a 3D model view generated by virtual fabrication performing the selective epitaxy process step in an embodiment of the present invention, respectively.
Figure 18B:
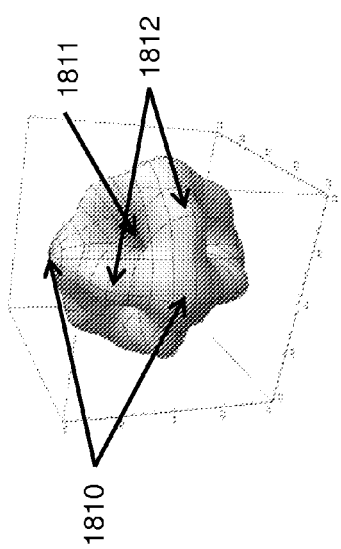

FIGS. 18A-C depict an exemplary process editor displaying information about a selective epitaxy process step modeling growth of crystalline materials, an example of a speed interpolation function and a related 3D model view generated by performing the selective epitaxy process step in an embodiment of the present invention. For example, in FIG. 18A, the process editor accepts input growth rate input parameters 1801, 1802 and 1803 for the major families of crystal planes. In another embodiment growth rate input parameters may also be received for minor families of crystal planes. Further, the editor also accepts input regarding material-specific overgrowth parameters 1808, 1809 for materials 1805, 1806. FIG. 18B depicts an example of a 3D speed "interpolation" function with respect to the major planes (<100>, <110>, <111>) 1810,1811,1812 as a 3D polar plot. The speed interpolation function has been empirically selected to interpolate smoothly between the specified growth rates on the major planes. FIG. 18C depicts the 3D viewer displaying a 3D view showing the results of an epitaxy step as it affects one of the major planes (<111>) 1820.

Figure 19C:
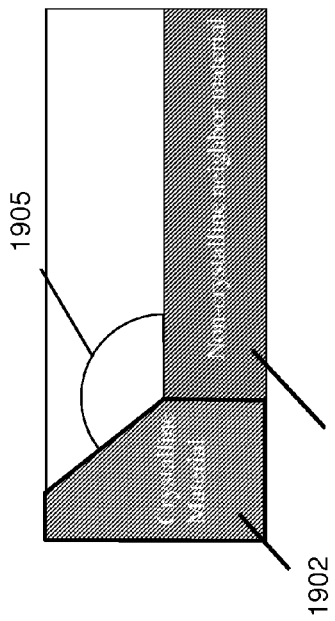
FIGS. 19A-19D depict exemplary schematic cross sections of a structure that has a crystalline seed material and a non-crystalline adjacent material and is undergoing a selective epitaxy process of the present invention.
Figure 19D:
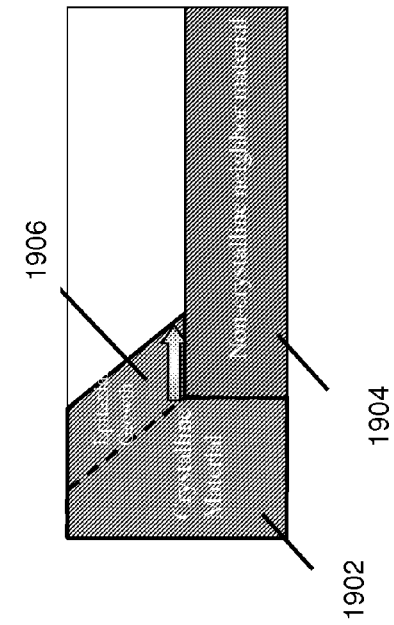
Figure 19A:
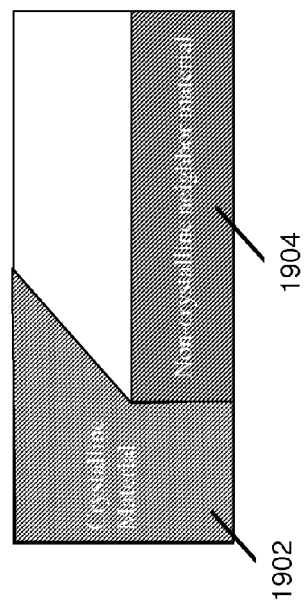
Figure 19B:
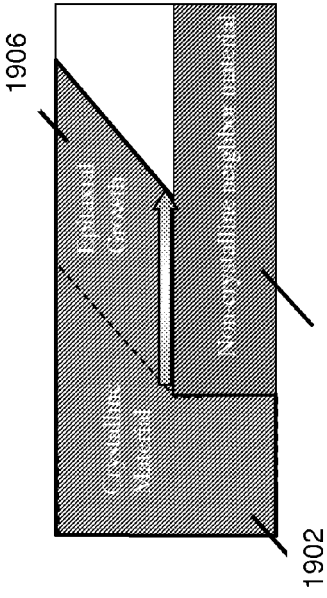

FIGS. 19A-19D depict exemplary schematic cross sections of a structure that has a crystalline seed material and a non-crystalline adjacent material and is undergoing a selective epitaxy process of the present invention. FIG. 19A depicts an example where the angle between adjacent crystalline 1902 and non-crystalline 1904 faces is less than 90 degrees. The input parameter "Overgrowth rate" 1808 controls the rate of epitaxial growth 1906 on the non-crystalline neighbor material 1904, as depicted in FIG. 19B. FIG. 19C depicts an example where the angle 1905 between adjacent crystalline 1902 and non-crystalline 1904 faces is greater than 90 degrees (i.e.: obtuse). The angle between the neighboring surfaces 1902 and 1904, whether acute or obtuse, may affect the rate of epitaxial growth on the neighboring non-crystalline material. As can be seen with reference to FIG. 19D, the obtuse angle 1905 between the materials results in a slower rate of epitaxial growth 1906. Though not depicted in FIG. 18A, the dependence of the overgrowth rate on this angle may be an input parameter to the selective epitaxy process step.

Figure 20:
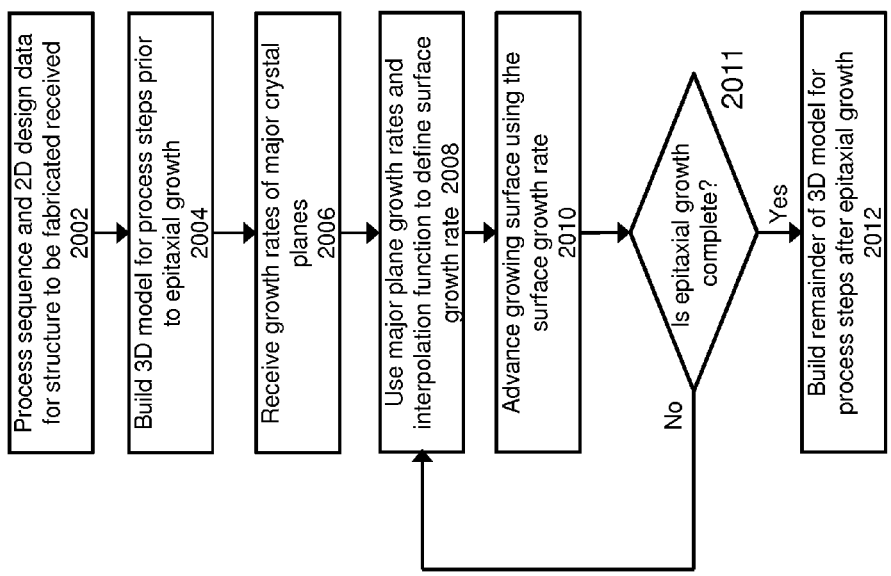
FIG. 20 depicts an exemplary sequence of steps followed by an embodiment of the present invention to perform selective epitaxy.

FIG. 20 depicts an exemplary sequence of steps followed by an embodiment of the present invention to perform selective epitaxy. The sequence begins by receiving a selection of 2D design data and a process sequence for a semiconductor structure to be virtually fabricated (step 2002). A virtual fabrication run is then performed to build the device structure using the process sequence and 2D design data. The virtual fabrication run builds a 3D structural model with a crystalline substrate seed surface by executing the process sequence prior to an epitaxial growth step (step 2004). Input data in the form of growth rates for the three major crystal planes is also received (step 2006) and the growth rate is computed at points of interest on the growing surface by combining the major crystal plane growth rates with an interpolation function (step 2008) The growing surface is then advanced using the surface growth rate (2010). If the epitaxial growth is complete (step 2011), the remainder of the 3D model is built by executing the process sequence that follows the epitaxial growth step (step 2012). If the epitaxial growth rate is not complete, the growth rates on the growing surface are re-computed and the growing surface is further advanced. The growing surface may be evolved in a time-based manner or a non-time based manner.

Figure 21A:
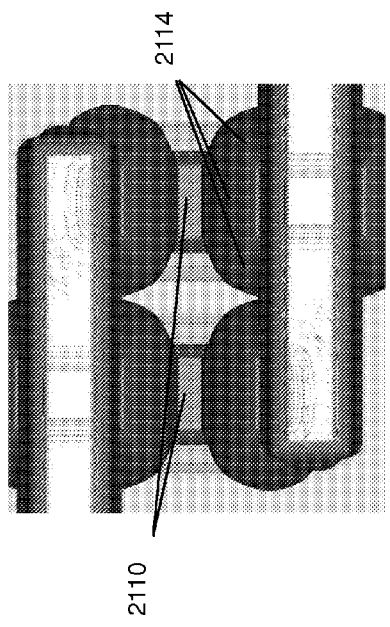
FIGS. 21A-21D depict an exemplary simulation of epitaxial growth involving overgrowth on adjacent non-crystalline materials performed by an embodiment of the present invention.
Figure 21B:
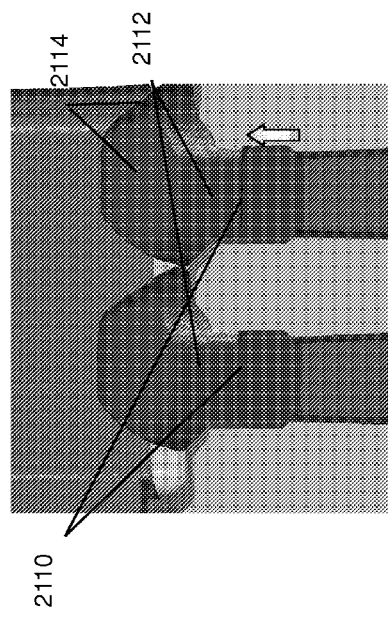
Figure 21C:
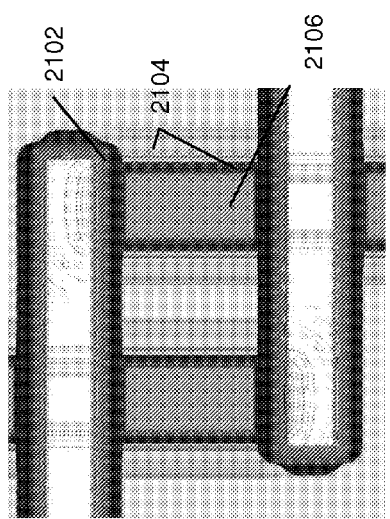
Figure 21D:
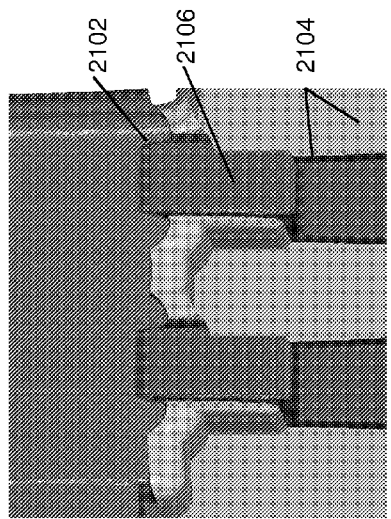

FIGS. 21A-21D depict an exemplary simulation of epitaxial growth involving overgrowth on adjacent non-crystalline materials performed by an embodiment of the present invention FIGS. 21A and 21B depict a top view and isometric view respectively of an exemplary structure containing a non-crystalline neighbor material, silicon nitride 2102. The structure also includes two layers of silicon dioxide 2104, and crystalline silicon 2106. FIGS. 21C and 21D depict the corresponding top and isometric reviews during a selective epitaxy step of the present invention. The views of the structure in FIGS. 21C and 21D enable the crystal planes <100> (2110), <110>(2112) and <111>(2114) to be visualized. The overgrowth speed determines the rate at which the growing surface moves up the neighboring silicon dioxide. All four views of the device structure may be displayed in the 3D viewer 125 of the virtual fabrication system of the present invention.

In another embodiment of the present invention, Design Rule Checks (DRCs) or Optical Rule Checks (ORCs) may be performed in a virtual fabrication environment. DRCs and ORCs have typically been performed by specialized software on 2D design data as part of the process of preparing 2D design data for conversion into photolithography masks. Such checks are performed for purposes of identifying errors in the layout that would result in non-functional or poorly functioning chips. The checks are also performed after adding compensations for optical effects such as optical proximity correction (OPC). Typical design rules (as published in design manuals and coded in DRC decks) are simple 2D criteria intended to prevent problems that are fundamentally 3D in nature. However, with the growing complexity of semiconductor process technology, design manuals have blossomed into thousand-page documents with thousands of 2D design rules to codify and explain. In many cases, a single 3D failure mechanism/concern can drive hundreds of 2D design rules. The development of those 2D design rules requires significant assumptions about the 3D nature of the integrated process flow and resulting structures.

Figure 22C:
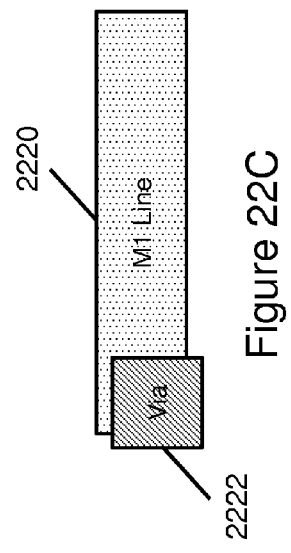
FIGS. 22A-22D depict a conventional application of 2D design rules to 2D design data.
Figure 22D:
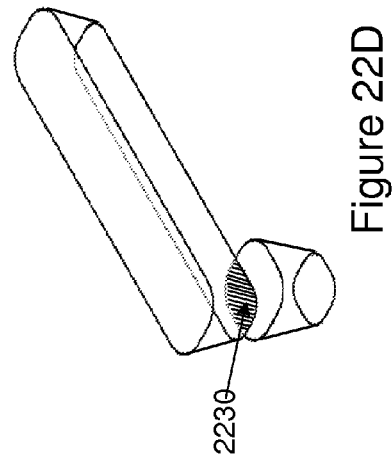
Figure 22A:
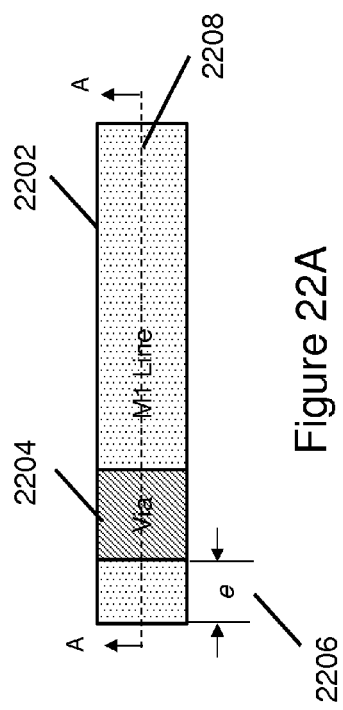
Figure 22B:
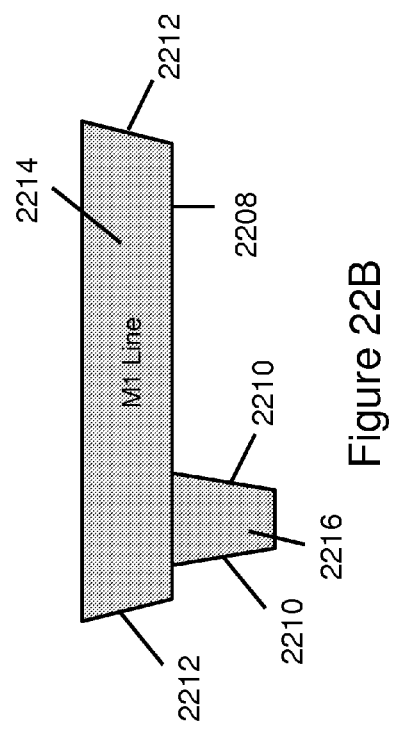

2D DRCs are developed from relatively simple calculations that may result in overly conservative designs. For example, consider the 2D design rules required to assure a minimum contact area between a line on a metal interconnect layer and an underlying via. A via is a vertical, electrically conductive connector between two interconnect layers, also called metal layers, or a vertical connector between an interconnect layer and a device such as a transistor, resistor or capacitor. FIGS. 22A-22D depict a conventional application of design rules to 2D design data. FIG. 22A shows 2D design data for a metal line 2202 and a via 2204. One possible 2D DRC states that the metal line must extend past the via on at least two opposing sides of the via, and that the extension must exceed a minimum value e(2206). FIG. 22A also indicates a cross section view A-A 2208 of the metal line and via. FIG. 22B shows a schematic cross section view A-A 2208 of the structure that would be fabricated from the design data in FIG. 22A. Note that the sidewalls 2210 and 2212 have tapers caused by the manufacturing process. If the extension e (2206) in the design data was insufficient, the fabricated metal line 2214 might not fully contact the top of the fabricated via 2216 (due to the sidewall tapers), and therefore the contact area between the two conductors would be reduced and possibly inadequate.

It may appear that in some cases the contact area between the metal line and underlying via could be estimated from a simple formula. However FIG. 22C shows another variation of the design data for a metal line 2220 and via 2222 that will require additional 2D DRCs. FIG. 22D shows a 3D view of the metal line 2220 and via 2222 as fabricated from the design data in FIG. 22C. Here the 2D shapes in the design data have become rounded due to lithography resolution effects and the sidewalls have tapers due to processing effects. It can be seen that the contact area 2230 between the metal line and the via has a more complex shape and that it would be difficult to calculate the contact area with a simple formula. Thus, it is apparent that many additional 2D DRCs are required to satisfy a criterion that is very simple to state in 3D: that the contact area between metal lines and vias must exceed a specified threshold value. The 2D DRC situation becomes even more complex when one considers that multiple manufacturing variations can affect the contact area, including over or under-exposure during lithography steps, mis-registration of the masks, planarization (via chemical mechanical polishing (CMP)) of the via layer, and the sidewall tapers produced by plasma etching. It is infeasible to include all of these statistical variations in the simple formulae that drive 2D DRCs, so the DRCs are stricter than necessary to guard against manufacturing variations. These overly strict 2D DRCs may result in sub-optimal designs with wasted area on the die.

In contrast to the 2D DRC environment, the virtual fabrication environment of the present invention may perform checks, such as minimum line width, minimum space between features, and minimum area of contacts, directly in 3D without making assumptions about the translation from 2D to 3D. Checks performed directly in 3D are referred to herein as "3D DRCs". One benefit of 3D DRC is that the required number of checks is significantly smaller than the number required in 2D environments. As a result, the checks are more robust and easier to develop than 2D checks. Furthermore, with a much smaller set of 3D rules, the virtual fabrication environment can perform the checks for a range of statistical variations in process parameters.

It should be appreciated that 3D-DRCs are distinct from virtual measurement/metrology operations that may also be performed in the virtual fabrication environment. The virtual measurement metrology operations mimic actual measurement and metrology operations in the fab, whereby a measurement location is specified and a metric such as a distance value or area is output. For 3D DRCs, on the other hand, a geometric criterion is specified and the location and value of the criterion are desired. That is, the location is an output of the 3D DRC operation rather than an input. For example, a virtual metrology operation may specify an oxide film thickness measurement at a specific location indicated by a locator in the 2D design data, whereas a 3D DRC for minimum layer thickness may request the location(s) anywhere in the 3D model where the oxide film thickness is less than a specified threshold value. The 3D structural model may then be searched for locations where the specified minimum dimensional criteria are satisfied. Similarly, a 3D DRC may also cause the structural model to be searched to see if a maximum dimensional criteria is satisfied. 3D DRCs of this type thus provide benefits unavailable with virtual measurement/metrology operations for identifying unexpected causes of failures.

. Examples of 3D-DRCs include:
Electrical Net Isolation: finds the shortest distance between selected conductors. A conductor is a lump that may be comprised of one or more conducting materials (a "lump" is a discrete volumetric region (technically, a 3-manifold) within a 3D structural model. A lump may be composed of a single material or multiple materials);
Minimum Separation: finds the shortest distance between any pair in a group of selected lumps;
Minimum Line Width, finds the shortest distance through any lump in a group of selected lumps;
Minimum Layer Thickness, finds the shortest distance through any lump in the collection of lumps that comprise a layer of material;
Minimum Contact Area: finds the smallest contact area between all pairs of selected lumps.

Lumps may be selected on the basis of constituent material(s), electrical conductivity or other properties. Each of the 3D DRC checks can be extended by specifying a threshold value. For example, specifying a threshold value for a Minimum Line Width check produces a list of locations where the minimum line width is less than the threshold value. Those skilled in the art will recognize that other checks of this nature may be defined.

Figure 23:
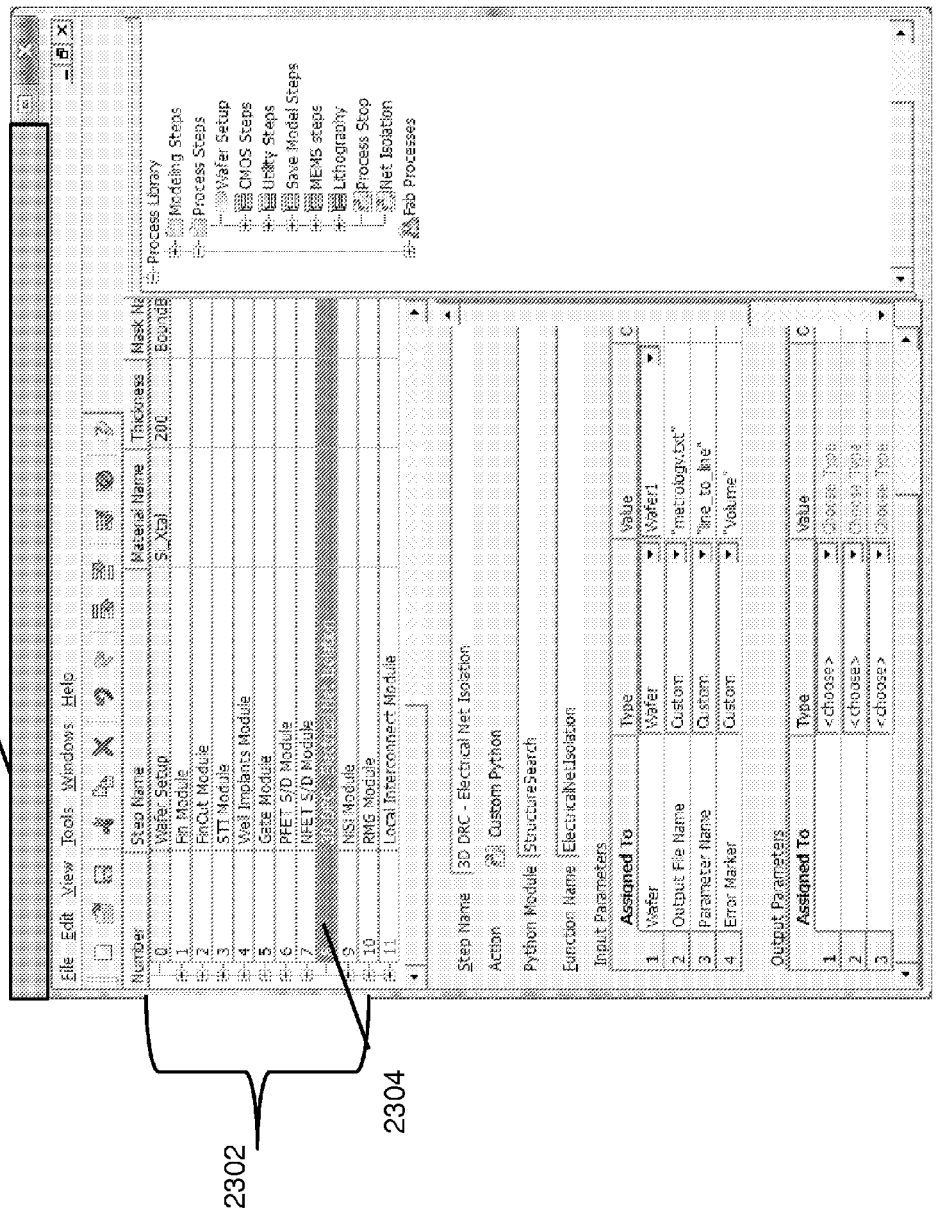
FIG. 23 depicts an exemplary 3D DRC for Electrical Net Isolation inserted in a process sequence in an embodiment of the present invention.

3D DRCs are available in the step library of the Process Editor and can be inserted by the user into process sequences or sub-sequences. FIG. 23 depicts an exemplary 3D DRC 2304 for Electrical Net Isolation inserted in a process sequence 2302 in an embodiment of the present invention Just as violations of 2D DRCs can be visualized in a 2D design tool such as a layout editor 121, violations of 3D DRCs can be visualized in the 3D Viewer 125 in the virtual fabrication system of the present invention.

Figure 24:
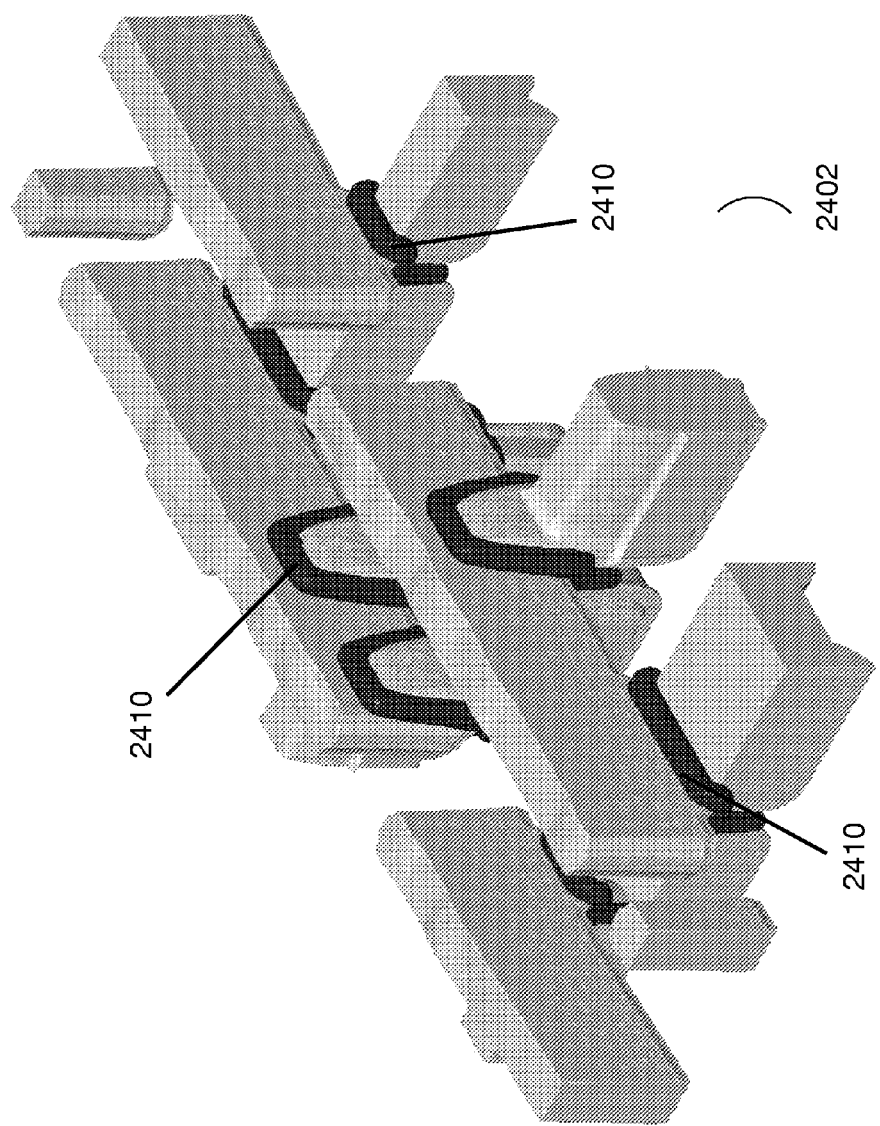
FIG. 24 depicts an exemplary 3D view, in the 3D Viewer, indicating violations of a 3D DRC, an Electrical Net Isolation check, performed by an embodiment of the present invention.

FIG. 24 depicts an exemplary 3D view 2402, in the 3D Viewer 125, indicating violations of a 3D DRC, an Electrical Net Isolation check, performed by an embodiment of the present invention. Violations may be indicated by colored regions 2410 in the 3D view 2402, which fill gaps between isolated conductors that are smaller than the threshold specified in the 3D DRC.

Figure 25:
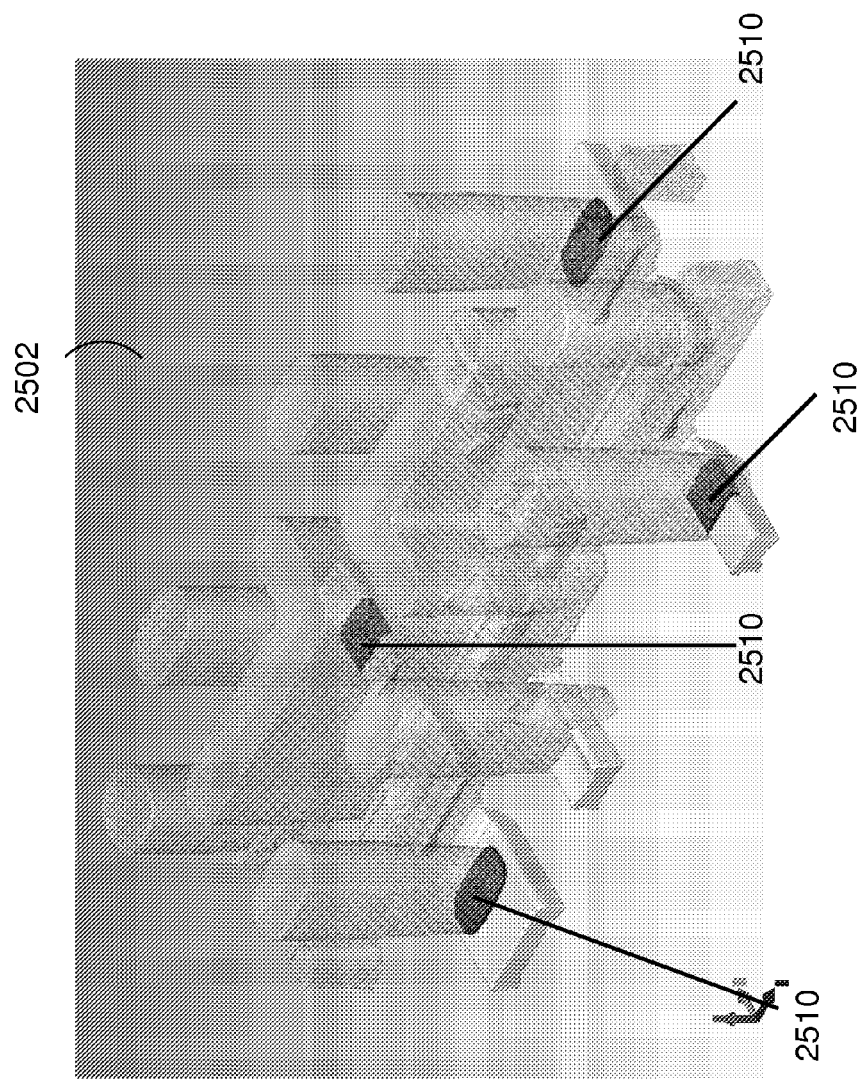
FIG. 25 depicts an exemplary 3D view, in the 3D Viewer, indicating violations of a 3D DRC, a Minimum Contact Area check, performed by an embodiment of the present invention.

FIG. 25 depicts an exemplary 3D view 2502, in the 3D Viewer 125, indicating violations of a 3D DRC, a Minimum Contact Area check, performed by an embodiment of the present invention. Areas 2510 may be highlighted in different colors so as to indicate the violations, i.e. contact areas that are less than the threshold specified in the 3D DRC.

The 3D DRCs of the present invention have at least two primary uses: as a tool for developing 2D DRC checks, and as a replacement for 2D DRCs. 2D DRCs are widely used in semiconductor design and their usage is well embedded in semiconductor design flows and tools. Considering, however, the shortcomings of the simple formulae underlying 2D DRCs and the lack of statistical input to these formulae, 3D DRCs in conjunction with virtual fabrication may be used as a tool for developing 2D DRCs. This use of 3D DRCs produces 2D DRC decks that are both more effective (resulting in fewer unexpected failures) and less conservative.

For example, an embodiment of the present invention allows a root-cause 3D failure mechanism, such as minimum contact area between two entities, to be identified. A set of test designs (2D design data) may be developed, covering all envisioned possibilities. Then, a candidate set of 2D DRCs may be developed and applied to the test designs. Subsequently, a virtual experiment may be conducted in the virtual fabrication environment of the present invention, using the test designs and the appropriate process variations. The root 3D DRC may be applied to each 3D model produced by the virtual experiment and statistics for failures of the 3D DRC may be recorded. Such statistics may include the number of failures per model, the extent of the failures (in comparison to a threshold) and the locations of the failures. These statistics may then be analyzed with the purpose of identifying possible improvements to the 2D DRCs. The 2D DRCs may then be refined and the process repeated to determine whether the statistics for 3D DRC failures had improved.

In addition, to producing improved 2D DRCs, the 3D DRC based-approach in the virtual fabrication environment of the present invention may instead completely replace 2D DRCs. DRCs must be applied at different levels of the 2D design hierarchy, including the device, standard cell and full chip levels. A standard cell is a sub-circuit that may be replicated at multiple locations within a full chip design. In one example, at the device and standard cell levels, 2D DRCs may be completely replaced with 3D DRCs. In another example, 3D DRCs may be applied to a full chip design.

Figure 26:
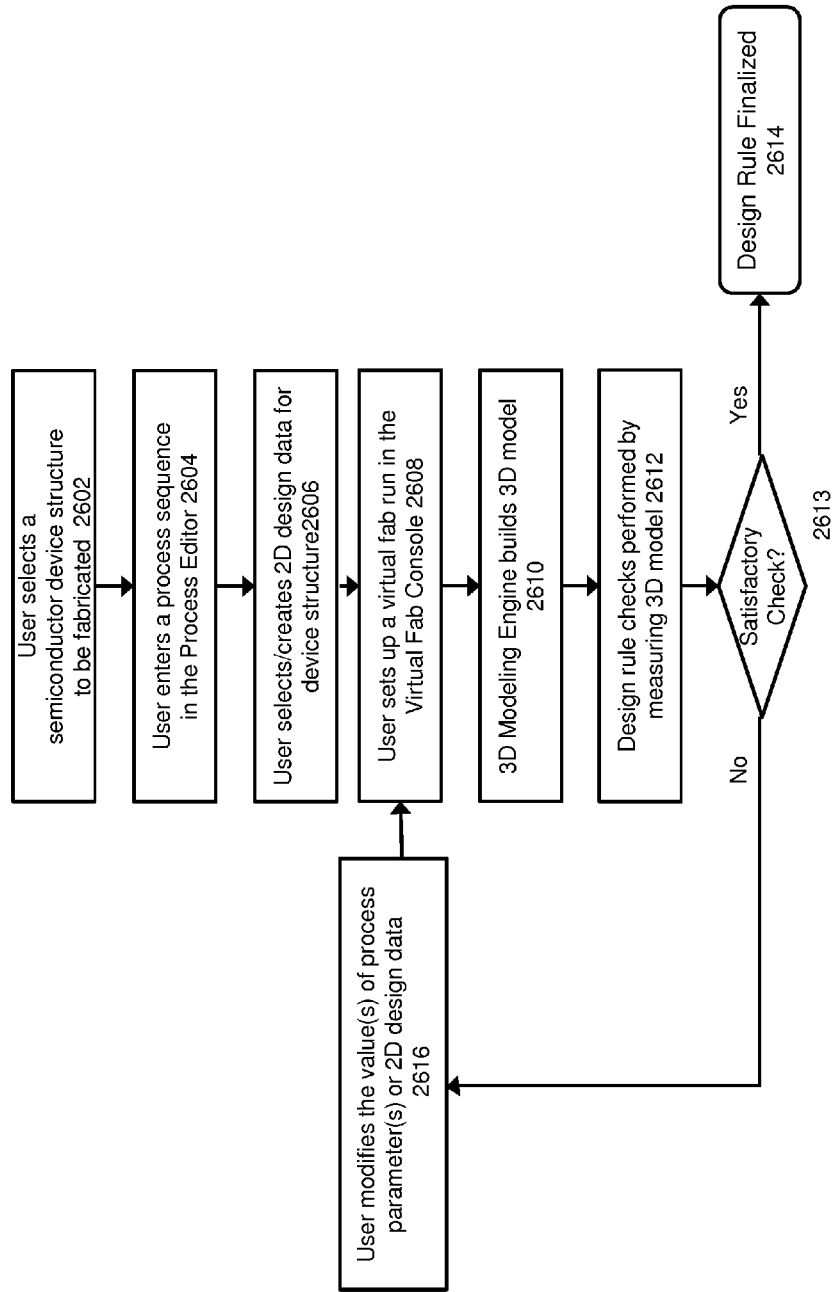
FIG. 26 depicts an exemplary sequence of steps followed by an embodiment of the present invention to perform 3D DRCs in a virtual fabrication environment.

FIG. 26 depicts an exemplary sequence of steps followed by an embodiment of the present invention to perform 3D DRCs in a virtual fabrication environment and to develop 2D DRCs from a 3D model. The sequence begins with the user selecting a semiconductor device structure to be fabricated (step 2602) and entering a process sequence in the process editor (step 2604). The user also creates 2D design data for the device structure (step 2606). The user then sets up a virtual fabrication run in the virtual fab console 123 (step 2608) and the 3D modeling engine 75 builds 3D structural model data 90 (step 2610). The produced 3D structural model data 90 may then be subject to 3D DRCs. It should be appreciated that previously generated 3D structural models may also be subject to 3D DRCs.

3D DRCs are performed by measuring the 3D model data 90 based on the specifics of the particular DRC (step 2612). For example, a minimum contact area check may be performed to determine whether a minimum contact area exists between two model entities. If the 3D design rule check is satisfactory (step 2613), an existing or new 2D DRC may be finalized (step 2614). If the 3D DRC is not satisfactory (step 2613), the user modifies one or more of the process parameters or the 2D design data used in virtually creating the device structure (step 2616) and returns to the virtual fab console 123 to set up a new virtual fabrication run (step 2608). The sequence may then iterate until the user is satisfied with the results of the 3D DRC. In an alternative embodiment, the decision on whether the 3D DRC is satisfactory may be made programmatically, such as by an automated design tool.

Portions or all of the embodiments of the present invention may be provided as one or more computer-readable programs or code embodied on or in one or more non-transitory mediums. The mediums may be, but are not limited to a hard disk, a compact disc, a digital versatile disc, a flash memory, a PROM, a RAM, a ROM, or a magnetic tape. In general, the computer-readable programs or code may be implemented in any computing language.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

The foregoing description of example embodiments of the invention provides illustration and description, but is not intended to be exhaustive or to limit the invention to the precise form disclosed. Modifications and variations are possible in light of the above teachings or may be acquired from practice of the invention. For example, while a series of acts has been described, the order of the acts may be modified in other implementations consistent with the principles of the invention. Further, non-dependent acts may be performed in parallel.

We claim:

1. A non-transitory computer-readable medium holding computer-executable instructions for performing and developing design rule checks with a 3D structural model for a semiconductor device structure, the instructions when executed causing the computing device to:
   receive a selection of a process sequence and 2D design data for a semiconductor device structure to be virtually fabricated;
   perform with the computing device a virtual fabrication run for the semiconductor device structure using the process sequence and 2D design data, the virtual fabrication run building a 3D structural model that is predictive of a result expected from a physical fabrication run, the 3D structural model including geometrically accurate 3D shapes of multiple layers of the semiconductor device structure; and
   perform a set of 3D design rule checks by searching the 3D structural model built from the virtual fabrication run for locations where specified minimum or maximum dimensional criteria are satisfied.

2. The medium of claim 1 wherein the instructions when executed further:
   produce at least one design constraint value required for a 2D rule-set abstraction based on the performing of the 3D design rule checks.

3. The medium of claim 1 wherein the instructions when executed further:
   perform a plurality of virtual fabrication runs that respectively build a plurality of 3D structural models,
   wherein the set of 3D design rule checks are performed on each 3D structural model.

4. The medium of claim 3 wherein the set of 3D design rule checks performed on each 3D structural model produces results that are summarized in at least one of a tabular format, X-Y plot or multi-dimensional plot.

5. The medium of claim 3 wherein the results of the performed 3D design rule checks for each 3D structural model are compared.

6. The medium of claim 1 wherein the instructions when executed further:
   determine a failure of the 3D design rule checks on the 3D structural model.

7. The medium of claim 6 wherein the instructions when executed further:
   display an indicator of the failure of the 3D design rule checks in a 3D view.

8. The medium of claim 6 wherein the instructions when executed further:
   receive a modification to the process sequence or 2D design data following the determination of a failure of the 3D design rule checks on the 3D structural model; and
   perform with the computing device an additional virtual fabrication run for the semiconductor device structure using the modified process sequence or modified 2D design data, the virtual fabrication run building a new 3D structural model; and
   perform the set of 3D design rule checks on the new 3D structural model.

9. A computing-device implemented method for performing and developing design rule checks with a 3D structural model for a semiconductor device structure, comprising:
   receiving a selection of a process sequence and 2D design data for a semiconductor device structure to be virtually fabricated;
   performing with the computing device a virtual fabrication run for the structure using the process sequence and 2D design data, the virtual fabrication run building a 3D structural model that is predictive of a result expected from a physical fabrication run, 3D structural model including geometrically accurate 3D shapes of multiple layers of the semiconductor device structure; and
   performing a set of 3D design rule checks by searching the 3D structural model built from the virtual fabrication run for locations where specified minimum or maximum dimensional criteria are satisfied.

10. The method of claim 9, further comprising:
producing at least one design constraint value required for a 2D rule-set abstraction based on the performing of the 3D design rule checks.

11. The method of claim 9, further comprising:
performing a plurality of virtual fabrication runs that respectively build a plurality of 3D structural models, wherein the set of 3D design rule checks are performed on each 3D structural model.

12. The method of claim 11 wherein the set of 3D design rule checks performed on each 3D structural model produces results that are summarized in at least one of a tabular format, X-Y plot or multi-dimensional plot.

13. The method of claim 11 wherein the results of the performed 3D design rule checks for each 3D structural model are compared.

14. The method of claim 9, further comprising:
determining a failure of the 3D design rule checks on the 3D structural model.

15. The method of claim 14, further comprising:
displaying an indicator of the failure of the 3D design rule checks in a 3D view.

16. The method of claim 14, further comprising:
receiving a modification to the process sequence or 2D design data following the determination of a failure of the 3D design rule checks by the 3D structural model; and
performing with the computing device an additional virtual fabrication run for the semiconductor device structure using the modified process sequence or modified 2D design data, the virtual fabrication run building a new 3D structural model; and
performing the set of 3D design rule checks on the new 3D structural model.

17. A virtual fabrication system, comprising:
a computing device equipped with a processor and configured to receive input data with a 3D modeling engine, the input data including 2D design data and a process sequence for a semiconductor device structure to be virtually fabricated, a virtual fabrication run for the semiconductor device structure building a 3D structural model upon which 3D design rule checks are performed by searching the 3D structural model for locations where specified minimum or maximum dimensional criteria are satisfied, the 3D structural model predictive of a result expected from a physical fabrication run and including geometrically accurate 3D shapes of multiple layers of the semiconductor device structure; and
a display surface in communication with the computing device and displaying results of the 3D design rule checks.

18. The virtual fabrication system of claim 13, further comprising:
a user interface enabling modification of a process sequence parameter and 2D design data.

19. The virtual fabrication system of claim 17 wherein an additional virtual fabrication run for the semiconductor device structure using the modified process sequence or modified 2D design data is performed, the virtual fabrication run building a new 3D structural model, the set of 3D design rule checks performed by searching the new 3D structural model for locations where specified minimum or maximum dimensional criteria are satisfied.

20. The virtual fabrication system of claim 17 wherein the process sequence includes at least one 3D design rule check.

* * * * *